(12) United States Patent
Kanda et al.

(10) Patent No.: US 7,544,522 B2
(45) Date of Patent: Jun. 9, 2009

(54) FABRICATION METHOD OF SEMICONDUCTOR INTEGRATED CIRCUIT DEVICE

(75) Inventors: Makoto Kanda, Tokyo (JP); Koji Watanabe, Tokyo (JP); Daisuke Hirota, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 358 days.

(21) Appl. No.: 11/628,776

(22) PCT Filed: Jun. 9, 2004

(86) PCT No.: PCT/JP2004/008414

§ 371 (c)(1),
(2), (4) Date: Dec. 7, 2006

(87) PCT Pub. No.: WO2005/122238

PCT Pub. Date: Dec. 22, 2005

(65) Prior Publication Data

US 2007/0231936 A1    Oct. 4, 2007

(51) Int. Cl.
H01L 21/66    (2006.01)
(52) U.S. Cl. .................. 438/16; 438/17; 257/E21.525
(58) Field of Classification Search .................. 438/15
See application file for complete search history.

(56) References Cited

U.S. PATENT DOCUMENTS

| | | | |
|---|---|---|---|
| 5,489,538 A * | 2/1996 | Rostoker et al. .............. 438/15 |
| 5,644,245 A | 7/1997 | Saitoh et al. | |
| 6,111,417 A * | 8/2000 | Kojima ........................ 324/754 |
| 6,305,230 B1 | 10/2001 | Kasukabe et al. | |
| 6,391,666 B2 * | 5/2002 | Huang et al. .................. 438/15 |
| 2002/0061606 A1 | 5/2002 | Honma et al. | |
| 2003/0122570 A1 * | 7/2003 | Byrd .......................... 324/765 |
| 2003/0222671 A1 * | 12/2003 | Cram ......................... 324/765 |
| 2006/0025956 A1 * | 2/2006 | Satake ........................ 702/118 |

FOREIGN PATENT DOCUMENTS

| | | |
|---|---|---|
| EP | 0999451 | 5/2000 |
| EP | 1022775 | 7/2000 |
| JP | 05-003239 | 1/1993 |
| JP | 05-074888 | 3/1993 |
| JP | 06-089929 | 3/1994 |
| JP | 07-094559 | 4/1995 |
| JP | 07-142547 | 6/1995 |

(Continued)

*Primary Examiner*—Stephen W Smoot
(74) *Attorney, Agent, or Firm*—Antonelli, Terry, Stout & Kraus, LLP.

(57) ABSTRACT

To prevent breakage of a membrane probe during a probe test using a probe card having the membrane probe, appearance of a main surface of a wafer as a test object is tested by an appearance tester 51, and results of bad appearance such as adhesion of a foreign substance to the main surface of the wafer and abnormality in shape of bump electrodes over the main surface of the wafer are collected as wafer map data according to arrangement of respective chips in a plane of the wafer, then the wafer map data are transmitted to a probe tester 53 via a server 52, and the probe tester 53 omits the probe test for chips in which bad appearance was detected, and concurrently performs the probe test to other chips in which bad appearance was not detected, based on the wafer map data.

17 Claims, 32 Drawing Sheets

FOREIGN PATENT DOCUMENTS

| | | |
|---|---|---|
| JP | 07-147304 | 6/1995 |
| JP | 07-283280 | 10/1995 |
| JP | 08-050146 | 2/1996 |
| JP | 08-201427 | 8/1996 |
| JP | 08-306748 | 11/1996 |
| JP | 10-308423 | 11/1998 |
| JP | 11-023615 | 1/1999 |
| JP | 11-097471 | 4/1999 |
| JP | 2000-150594 | 5/2000 |
| JP | 2001-159643 | 6/2001 |
| JP | 2002-163900 | 6/2002 |
| WO | WO 95/34000 | 12/1995 |

* cited by examiner

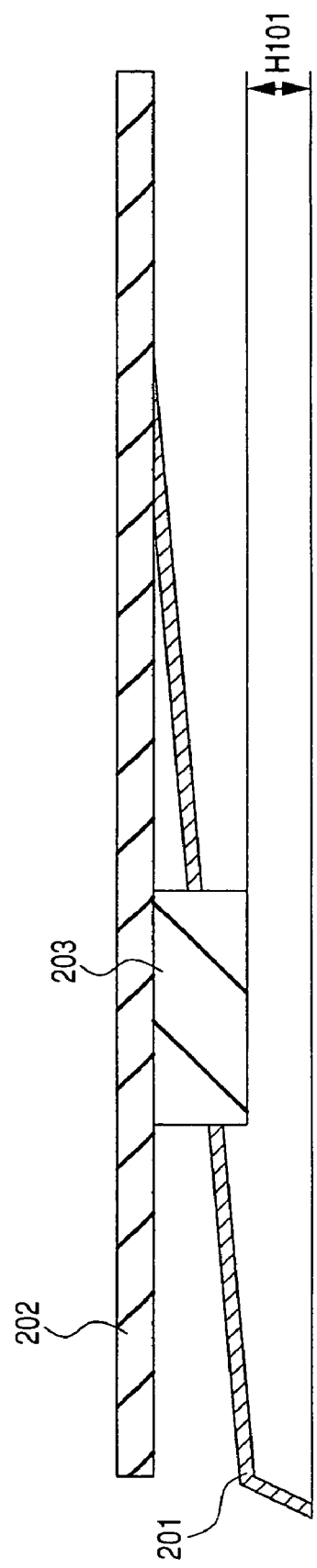

FABRICATION METHOD OF SEMICONDUCTOR INTEGRATED CIRCUIT DEVICE

TECHNICAL FIELD

The present invention relates to a technique of fabricating a semiconductor integrated circuit device, and particularly relates to a technique effectively used for an electric test of a semiconductor integrated circuit on which a number of electrode pads are disposed at a narrow pitch.

BACKGROUND ART

For example, Japanese Patent Laid-open Nos. 7-283280, 8-50146 (corresponding to international publication WO 95/34000), 8-201427, 11-23615 (corresponding to U.S. Pat. No. 6,305,230), 2001-159643, 10-308423, 11-97471 (corresponding to European Patent No. EP 1022775), and 2000-150594 (corresponding to European Patent No. EP 0999451) disclose a structure of a prober having a probe (contact terminal) formed using a technique of fabricating a semiconductor integrated circuit device, an insulating film, and lead lines, a method of fabricating the prober, and a technique of enabling practice of a probe test even for a chip having test pads with a reduced pitch by using the prober.

Japanese Patent Laid-open No. 2002-163900 (corresponding to U.S. patent Application Publication No. US 2002/061606, published at May, 23, 2002) discloses a technique that enables omission of the probe test to bad chips by performing the probe test only to chips determined as good chips in wafer level burn-in.

Japanese Patent Laid-open No. 5-74888 discloses a technique that enables omission of the probe test to the chips determined as bad chips by excluding chips determined as bad chips in a chip appearance test from an object of a characteristic test, and performing the characteristic test to only chips determined as good chips in the appearance test.

Japanese Patent Laid-open No. 7-94559 discloses a technique in which chips on a wafer added with a bad mark by image processing are subjected to an electrical characteristic test while being not contacted with a probe needle, thereby the probe test can be omitted to bad chips.

Japanese Patent Laid-open No. 7-142547 discloses a technique that enables reduction in total test time by detecting bad chips on a wafer by a chip appearance tester, and furthermore specifying bad chips that were not relieved, and omitting the test to the specified bad chips.

Japanese Patent Laid-open No. 7-147304 (corresponding to U.S. Pat. No. 5,644,245) discloses a technique that enables prevention of production of bad chips due to a needle mark trouble, by performing a probe test to subsequent chips when a needle mark of a probe needle is within tolerance, and omitting the probe test when the needle mark is out of tolerance.

Japanese Patent Laid-open No. 5-3239 discloses a technique that enables omission of formation of unnecessary bump electrodes by performing the a probe test while excluding chips in a peripheral region of a wafer where bad chips produced in a wafer processing process from an object of the probe test, then omitting formation of bump electrodes on the chips in the peripheral region of the wafer.

Japanese Patent Laid-open No. 8-306748 discloses a technique that enables improvement in throughput of the probe test by first performing the probe test to all elements on a wafer, then performing remedy, and then performing a second probe test to elements except for unrelievable elements.

Japanese Patent Laid-open No. 6-089929 discloses a technique that incorporates an electrically writable, permanent recording unit for each of chips in a wafer, so that tests are performed to only robust chips after certain chips were determined as bad chips in a result of a certain test.

DISCLOSURE OF THE INVENTION

As a technique of testing a semiconductor integrated circuit device, for example, a probe test is given. The probe test includes a function test for confirming whether a device works according to a predetermined function, and a test for determining whether a device is good or bad through testing a DC operating characteristic or an AC operating characteristic.

Maltifunctionality of a semiconductor integrated circuit device has made much progress in recent years, and elaboration of a plurality of circuits in one semiconductor chip (hereinafter, simply mentioned as chip) is promoted. Moreover, to decrease fabrication cost of the semiconductor integrated circuit device, it is promoted that a semiconductor element and a wiring line are reduced in size so that area of a semiconductor chip (hereinafter simply referred to chip) is reduced, consequently the number of obtained chips per wafer is increased. Therefore, the number of test pads (bonding pads) is increased, in addition, a pitch in arrangement of the test pads is reduced, and area of the test pad is also reduced. In association with such reduction in pitch of the test pads, there is a problem that when a prober having cantilever-like probes is used for the probe test, the probes are hard to be set in alignment with disposed positions of the test pads.

The inventors have investigated a technique that enables realization of the probe test even for a chip having test pads with a reduced pitch by using a prober having probes formed using a fabrication technique of the semiconductor integrated circuit device. In such investigation, the inventors found the following problems.

That is, the prober has a probe card having a membrane probe formed by performing deposition of a metal film and a polyimide film, and patterning of the films using the fabrication technique of the semiconductor integrated circuit device. In the membrane probe, part of the metal film is formed as probes being finely patterned using the fabrication technique of the semiconductor integrated circuit device, which can be adapted for the test pads with the reduced pitch. In the case of using such a probe card, if a foreign substance is adhered on a surface of a chip as a test object, the foreign substance may be touched to the membrane probe when a probe is contacted to a test pad, consequently the membrane probe may be broken. Moreover, in the case that abnormality occurs in shape of the test pad, the membrane probe may be broken. There is a problem that when the membrane probe is broken in this way, the probe test may be continued while breakage is not noticed, consequently an accurate test result is not obtained.

Moreover, there is a problem that when breakage of the membrane probe is noticed, the probe test needs to be performed again after exchange of the probe card to a chip that seems to be not given with an accurate test result due to the breakage of the membrane probe, consequently time required for the probe test is increased.

An object of an invention disclosed in the application is to provide a technique for preventing breakage of the membrane probe in the probe test performed using the probe card having the membrane probe.

Summaries of typical inventions among inventions disclosed in the application are briefly described as follows.

A fabrication method of a semiconductor integrated circuit device according to the invention comprising the step of;

(a) preparing a semiconductor wafer, in which the wafer is divided into a plurality of chip regions, a semiconductor integrated circuit is formed in each of the chip regions, and a plurality of first electrodes are formed over a main surface, each of the first electrode being to be electrically coupled to the semiconductor integrated circuit, (b) testing appearance of the main surface in the chip regions, and recording first positions, at which first chip regions where abnormality in appearance was detected are disposed, as first data, (c) preparing a first card having a wiring board having first wiring lines formed thereon; a first sheet on which a plurality of connection terminals for contacting to the first electrodes, and second wiring lines to be electrically coupled to the connection terminals are formed, the second wiring lines being electrically coupled to the first wiring lines, and ends of the connection terminals being held facing corresponding electrodes among the first electrodes; and a pressing mechanism for pressing regions in which the connection terminals are formed in the first sheet from a back, and (d) contacting the ends of the connection terminals to the first electrodes for each of the chip regions to perform an electrical test of the semiconductor integrated circuit, and for the first chip region, and not contacting the ends of the connection terminals to the first electrodes to omit the electrical test of the semiconductor integrated circuit, based on the first data.

Other summaries of inventions disclosed in the application are briefly described in an itemized manner as follows.

1. A fabrication method of a semiconductor integrated circuit device comprising the following steps of;

(a) preparing a wafer in which a wafer process is substantially completed, and bonding pad openings or bump electrodes (while gold bumps containing gold as a major component is described here, the bumps may be solder-gold bumps or silver bumps) over bonding pads (while pads for wire bonding are typically Al pads mainly containing aluminum, the pads may be those for bonding other than wire bonding) are formed in the chip regions respectively, in a process of fabricating a semiconductor integrated circuit (typically, several or many electrodes for probes such as bonding pads are provided for each chip region);

(b) performing an appearance test (typically performed in an optical method) for at least the bonding pad openings or the bump electrodes and the peripheries of them in each of the chip regions over the wafer; and (c) performing the probe test for a second group of chip regions that do not belong to the first group using the membrane probe, without performing the probe test for a first group of one or more chip regions, which are inappropriate (here, mainly determined by presence of damage to the membrane probe or the like) to be subjected to the probe test using the membrane probe, among the chip regions, based on a result of the appearance test when the chip regions are subjected to a probe test using a membrane probe (the probe test itself may be performed for each chip region, or for several chips at a time).

2. In the fabrication method of the semiconductor integrated circuit device according to item 1;

projection needles of the membrane probe are not contacted to the bonding pads or the bump electrodes as electrodes for probes for the first group of chip regions during the probe test of the step (c) (For example, an upper limit of height of a foreign substance or an abnormal pattern in a process of a wafer having bumps is considered to be approximately the same as height of the bumps. Therefore, unless the projection needles are contacted to the electrodes for probes, even if foreign substances or the like exist on the electrodes for probes or in the neighborhood of them, fatal damage to the probes is not considered to be induced. Moreover, since damage is considered to occur due to pressing for achieving ohmic contact for electrical measurement, if slight damage to the projection needles due to contact to the foreign substances is neglected, when the projection needles are nominally contacted to the electrodes for probes in the chip region having abnormality I appearance, but not pressed thereto, substantially, damage to the membrane probe and the like can be extremely suppressed.)

3. In the fabrication method of the semiconductor integrated circuit device according to the item 1;

for the first group of chip regions, the projection needles of the membrane probe are not contacted to the bonding pads or the bump electrodes as electrodes for probes to a level at which at least electrical measurement can be performed for the first group of chip regions during the probe test of the step (c).

4. In the fabrication method of the semiconductor integrated circuit device according to any one of the items 1 to 3;

the appearance test of the step (b) includes a step of optically testing whether the foreign substance or abnormal pattern on the wafer damages the membrane probe during the probe test of the step (c).

5. In the fabrication method of the semiconductor integrated circuit device according to any one of the items 1 to 4;

the appearance test of the step (b) comprises the following subordinative steps of;

(1) performing the appearance test to the bonding pad openings or the bump electrodes and peripheries of them at first accuracy; and (2) performing the appearance test to portions other than the bonding pad openings or the bump electrodes and the peripheries of them at second accuracy rougher than first accuracy.

6. In the fabrication method of the semiconductor integrated circuit device according to any one of the items 2 to 5;

the electrodes for probes are bump electrodes.

7. In the fabrication method of the semiconductor integrated circuit device according to any one of the items 2 to 5;

the electrodes for probes are bonding pads.

8. In the fabrication method of the semiconductor integrated circuit device according to any one of the items 2 to 6;

the electrodes for probes are bump electrodes containing gold as a major component.

9. In the fabrication method of the semiconductor integrated circuit device according to any one of the items 2 to 5 and 7;

the electrodes for probes are bonding pads containing aluminum as a major component.

10. In the fabrication method of the semiconductor integrated circuit device according to any one of the items 1 to 9;

at least part of an interconnection layer below the bonding pads or the bump electrodes includes a buried wiring line formed of a wiring material containing copper as a major component.

11. A fabrication method of a semiconductor integrated circuit device comprising the following steps of;

(a) preparing a wafer in which a wafer process is substantially completed, and electrodes for probes are formed in a plurality of chip regions respectively, in a fabrication process of a semiconductor integrated circuit;

(b) performing an appearance test for at least the electrodes for probes and peripheries of them in each of the chip regions over the wafer; and (c) performing the probe test for a second group of chip regions that do not belong to the first group using the membrane probe, without performing the probe test for a first group of one or more chip regions, which are inappropriate to be subjected to the probe test using the membrane probe, and contacting projection needles of the membrane probe to the electrodes for probes, among the chip regions, based on a result of the appearance test when the chip regions are subjected to a probe test using a membrane probe.

12. In the fabrication method of the semiconductor integrated circuit device according to the item 11;

the appearance test of the step (b) includes optically testing whether a foreign substance or an abnormal pattern over the wafer damages the membrane probe during the probe test of the step (c).

13. In the fabrication method of the semiconductor integrated circuit device according to the item 11 or 12, the appearance test of the step (b) comprises the following subordinative steps of;

(1) performing the appearance test to the electrodes for probes and peripheries of them at first accuracy; and (2) performing the appearance test to portions other than the electrodes for probes and the peripheries of them at second accuracy rougher than the first accuracy.

14. In the fabrication method of the semiconductor integrated circuit device according to any one of the items 11 to 13, the electrodes for probes are bump electrodes.

15. In the fabrication method of the semiconductor integrated circuit device according to any one of the items 11 to 13, the electrodes for probes are bonding pads.

16. In the fabrication method of the semiconductor integrated circuit device according to any one of the items 11 to 14, the electrodes for probes are bump electrodes containing gold as a major component.

17. In the fabrication method of the semiconductor integrated circuit device according to any one of the items 11 to 13 and 15, the electrodes for probes are bonding pads containing aluminum as a major component.

18. In the fabrication method of the semiconductor integrated circuit device according to any one of the items 11 to 17, at least part of an interconnection layer below the electrodes for probes includes a buried wiring line formed of a wiring material containing copper as a major component.

19. A fabrication method of a semiconductor integrated circuit device comprising the following steps of;

(a) preparing a wafer in which a wafer process is substantially completed, and gold bump electrodes containing gold as a major component are formed in a plurality of chip regions respectively, in a process of fabricating a semiconductor integrated circuit;

(b) performing an appearance test for at least the gold bump electrodes and peripheries of them in each of the chip regions over the wafer; and (c) performing the probe test for a second group of chip regions that do not belong to the first group using the membrane probe, without performing the probe test for a first group of one or more chip regions, which are inappropriate to be subjected to the probe test using the membrane probe, and contacting projection needles of the membrane probe at the gold bump electrodes to a level at which at least electrical measurement can be performed, among the chip regions, based on a result of the appearance test when the chip regions are subjected to a probe test using a membrane probe.

20. In the fabrication method of the semiconductor integrated circuit device according to the item 19;

the appearance test of the step (b) comprises the following subordinative steps of, (1) performing the appearance test to the gold bump electrodes and peripheries of them at first accuracy; and (2) performing the appearance test to portions other than the gold bump electrodes and the peripheries of them at second accuracy rougher than first accuracy.

21. A fabrication method of a semiconductor integrated circuit device comprising the following steps of;

(a) preparing a wafer in which a wafer process is substantially completed, and electrodes for probes are formed in the chip regions respectively, in a fabrication process of a semiconductor integrated circuit;

(b) performing an appearance test to at least the electrodes for probes and peripheries of them in each of the chip regions over the wafer; and (c) performing the probe test for a second group of chip regions that do not belong to the first group using the micro-needle height probe, without performing the probe test for a first group of one or more chip regions, which are inappropriate to be subjected to the probe test using the micro-needle height probe, and contacting a projection needle of the micro-needle height probe to the electrodes for probes, based on a result of the appearance test, among the chip regions, when a probe test is carried out using a micro-needle height probe (in a usual cantilever type, even if a wafer had a foreign substance or the like having several ten micrometers in height, height difference in a surface direction parallel to a main surface of the wafer between an end of a probe needle and a needle supporter for supporting the probe needle is several hundred micrometers or more, which was completely not problematic; however, in the micro-needle height probe represented by the membrane probe, since needle height is typically 90 µm or less, the probe or a wafer to be measured may be damaged at high possibility depending on a shape, a place, or an attribute of the foreign substance).

22. In the fabrication method of the semiconductor integrated circuit device according to the item 21;

height of the projection needle of the micro-needle height probe is 90 µm or less.

23. In the fabrication method of the semiconductor integrated circuit device according to the item 21;

height of the projection needle of the micro-needle height probe is 50 µm or less.

24. In the fabrication method of the semiconductor integrated circuit device according to the item 21;

height of the projection needle of the micro-needle height probe is 30 µm or less.

25. In the fabrication method of the semiconductor integrated circuit device according to the item 21;

height of the projection needle of the micro-needle height probe is 20 µm or less.

Furthermore, other summaries of inventions disclosed in the application are briefly described in an itemized manner as follows.

1. A fabrication method of a semiconductor integrated circuit device comprising the following steps of;

(a) preparing a semiconductor wafer, in which the wafer is divided into a plurality of chip regions, a semiconductor integrated circuit is formed in each of the chip regions, and a plurality of first electrodes are formed over a main surface, each of the first electrode being to be electrically coupled to the semiconductor integrated circuit, (b) testing appearance of the main surface in the chip regions, and recording first positions, at which first chip regions where abnormality in appearance was detected are disposed, as first data, (c) preparing a first card having a wiring board having first wiring lines formed thereon; a first sheet on which a plurality of connection terminals for contacting to the first electrodes, and second wiring lines to be electrically coupled to the connection terminals are formed, the second wiring lines being electrically coupled to the first wiring lines, and ends of the connection terminals being held facing corresponding electrodes among the first electrodes; and a pressing mechanism for pressing regions in which the connection terminals are formed in the first sheet from a back, and (d) contacting the ends of the connection terminals to the first electrodes for each of the chip regions to perform an electrical test of the semiconductor integrated circuit, and for the first chip region, and not contacting the ends of the connection terminals to the first electrodes to omit the electrical test of the semiconductor integrated circuit, based on the first data.

2. In the fabrication method of the semiconductor integrated circuit device according to the item 1,
the first electrodes are projection electrodes.

3. In the fabrication method of the semiconductor integrated circuit device according to the item 2,
the abnormality in appearance is abnormality in section profile of the projection electrodes or adhesion of a foreign substance to the main surface in the chip regions.

4. In the fabrication method of the semiconductor integrated circuit device according to the item 2,
the step (b) includes
(b1) a step that in each of the chip regions, a region inside the outer circumference of the chip region by a first distance with respect to the first electrode is divided into a plurality of first regions, and the appearance is tested for each of the first regions.

5. In the fabrication method of the semiconductor integrated circuit device according to the item 4,
the projection electrodes are in a rectangular shape having a long side and a short side in a plane, and
the first distance is longer than the short side of the projection electrode in a plane.

6. In the fabrication method of the semiconductor integrated circuit device according to the item 4,
each of the first regions is in a rectangular shape of which the side is 10 μm or less.

7. In the fabrication method of the semiconductor integrated circuit device according to the item 4,
the step (b) includes
(b2) a step that regions other than the first regions are divided into a plurality of second regions having large area compared with the first regions, then the appearance is tested for each of the second regions.

8. In the fabrication method of the semiconductor integrated circuit device according to the item 1,
the first electrodes are disposed under the projection electrodes disposed over the main surface in the chip regions, which are pad electrodes to be electrically coupled to the projection electrodes, and
the step (d) is performed before forming the projection electrodes.

9. In the fabrication method of the semiconductor integrated circuit device according to the item 1,
the first electrodes are active regions formed over the main surface of the semiconductor wafer in each of the chip regions, and a plurality of wiring layers formed over the main surface, and
the step (d) is performed for every formation of the active regions and the wiring layers.

10. In the fabrication method of the semiconductor integrated circuit device according to the item 1,
each of the first electrodes is a projection electrode containing gold as a major component, which is in a rectangular shape having a long side and a short side in a plane, and the long side extends toward the outer circumference of the chip region.

11. In the fabrication method of the semiconductor integrated circuit device according to the item 10,
an interval between the first electrodes adjacent to each other corresponds to a distance shorter than the short side.

12. In the fabrication method of the semiconductor integrated circuit device according to the item 10,
the first electrodes are arranged along the outer circumference of the chip region respectively,
an interval between the first electrodes adjacent to each other is 15 μm or less, and
the first electrodes adjacent to each other are disposed at every second distance, the second distance being 34 μm or less.

13. In the fabrication method of the semiconductor integrated circuit device according to the item 10,
the semiconductor integrated circuit includes an LCD driver.

14. In the fabrication method of the semiconductor integrated circuit device according to the item 1,
each of the chip regions has a plurality of wiring layers formed over the main surface, and
the first electrodes are included in the wiring layer as a top layer among the wiring layers.

15. In the fabrication method of the semiconductor integrated circuit device according to the item 14,
the first electrodes are arranged along the outer circumference of the chip region respectively,
an interval between the first electrodes adjacent to each other is 15 μm or less, and
the first electrodes adjacent to each other are disposed at every second distance, the second distance being 34 μm or less.

BRIEF DESCRIPTION OF THE DRAWINGS

FIG. 53 shows a relevant-part section view of a probe card in a cantilever type.

BEST MODE FOR CARRYING OUT THE INVENTION

Figure 1:
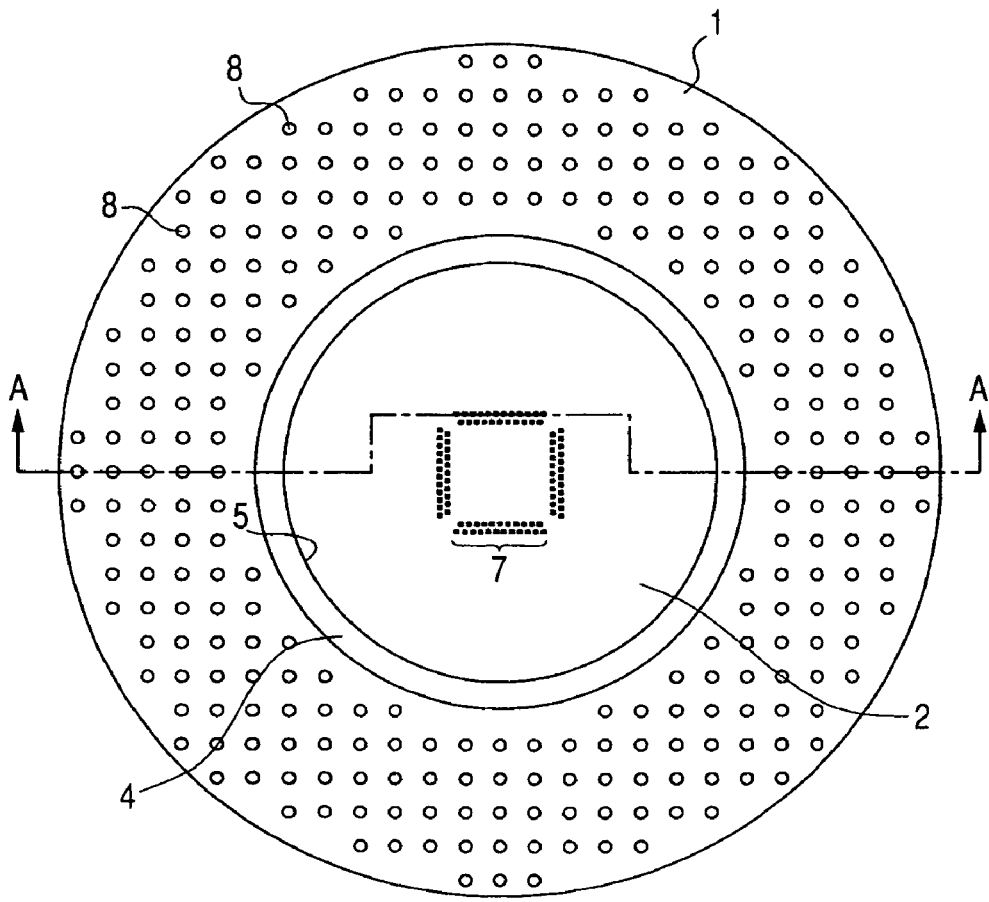
FIG. 1 shows a relevant-part plane view of a bottom of a probe card of an embodiment of the invention.

Before the invention of the application is described in detail, meanings of terms in the application are described as follows.

A wafer is a single crystal silicon substrate (typically in an approximately planar circle shape), an SOI (Silicon On Insulator) substrate, a sapphire substrate, a glass substrate, another insulating, anti-insulating or semiconductor substrate, and a composite substrate of them. A semiconductor integrated circuit device referred in the application includes not only a device formed over a semiconductor or an insulator substrate such as silicon wafer or sapphire substrate, but also a device formed over another insulating substrate such as glass, including TFT (Thin Film Transistor) and STN (Super-Twisted-Nematic) liquid crystal devices, except for a case of particularly specifying the device to be not included.

A device surface is a main surface of the wafer, on which a device pattern corresponding to a plurality of chip regions is to be formed by lithography.

A micro-needle height probe is a probe for a narrow-pitch semiconductor integrated circuit, having a needle height of 50 µm or less (at most 90 µm or less), and further desirably 30 µm or less, unlike a usual probe card in a cantilever type including a probe 201, probe substrate 202, and needle holder part 203, as shown in FIG. 53, in which a distance (that is, needle height H101) between an end of the probe 201 and a portion substantially supporting the end (needle holder part 203) is approximately several hundred micrometers or more. A typical example of the micro-needle height probe is the membrane probe described in detail in the embodiment. In the case of the membrane probe, needle height is typically height of a needle end measured from a sheet surface (reference surface) near the needle.

A contact terminal is a wiring layer and an end portion electrically coupled thereto, which are integrally formed by a wafer process similar to a process used for fabrication of a semiconductor integrated circuit, that is, a patterning method of a combination of a photolithography technique, a CVD (Chemical Vapor Deposition) technique, a sputtering technique, an etching technique and the like.

A membrane probe, membrane probe card, or projection needle wiring sheet composite is a membrane on which the contact terminal (projection needle) to be contacted to a test object, and wiring lines led from the contact terminal are provided, the wiring lines having electrodes for external contact formed thereon, and the membrane having thickness of about 10 to 100 µm.

A probe card is a structure having the contact terminal to be contacted to the wafer as a test object, and a multilayer wiring board or the like. The semiconductor tester is a tester having the probe card and a sample supporting system for carrying the wafer as the test object.

The probe test is an electrical test performed using a prober to a wafer in which a wafer process is completed, and an electrical test of a semiconductor integrated circuit device performed by contacting an end of the contact terminal to electrodes formed over the main surface in chip regions, which discriminates whether the circuit is good or bad by a function test for confirming whether the circuit works according to a predetermined function or DC and AC operational characteristic tests. It is distinguished from a screening test (final test) performed after dividing the wafer into individual chips (or after packaging is completed). Results of the probe test are collected as a wafer map described later.

The wafer appearance tester performs a size or shape measurement such as fine-pattern size measurement, blood vessel inspection, thickness measurement, and flatness measurement, or an inspection such as particle measurement for inspecting a foreign substance. These measurements and inspections (hereinafter, referred to wafer appearance test) are carried out in predetermined resolution, and measurement results and inspection results are collected as the following wafer map.

The wafer map is indication of the results of the probe test and the results of the wafer appearance test according to arrangement of chip regions or arrangement of the measured or inspected regions, and used for determination of distribution of a wafer processing condition or quality of wafer processing.

A server is a computer as the center of a network, and includes a file server that stores a file on the network and allows a user coupled to the network to use the file. In the application, the wafer map data corresponds to the file.

While the following embodiments are described with being divided into a plurality of sections or embodiments if it is necessary for convenience, they are not independent of one another except for a particularly specified case, and in such a relationship with one another that one is partially or wholly a modification, detail, or complementary description.

In the following embodiments, when the number of elements (including number of pieces, numeral values, quantity, and range) is mentioned, it is not limited to a specified number, and may be the specified number or more, or less, except for a particularly specified case, or a case of being obviously limited to the specified number in principle.

Furthermore, it will be obvious that in the following embodiments, components (including element steps) are not necessarily essential except for a particularly specified case, or a case of being obviously considered to be essential in principle.

Similarly, in the following embodiments, when a shape, a positional relationship or the like of the components is mentioned, those substantially approximate or similar to the shape or the like are included except for a particularly specified case, or a case of being obviously considered to be not so in principle. This is the same for the numeral values and ranges.

In all figures for explaining the embodiments, elements having the same function are marked with the same mark, and repeated description of them is omitted.

A drawing used in the embodiments is sometimes partially marked with hatching for ease in viewing even if it is a plane view.

In the embodiments, an insulated gate field effect transistor is called MISFET (Metal Insulator Semiconductor Field Effect Transistor), including MOSFET (Metal Oxide Semiconductor Field Effect Transistor).

Since various details of the membrane probe by the semiconductor lithography technique used in the application are disclosed in the following patent applications by the inventor and relevant inventors, contents of the details are not repeated except for a particularly necessary case. The patent applications, that is, Japanese Patent Applications Nos. 2002-289377 (corresponding to U.S. patent application Ser. No. 10/676,609 filed on Oct. 2, 2003), 2002-294376, 2003-189949, 2003-075429 (corresponding to U.S. patent application Ser. No. 10/765,917 filed on Jan. 29, 2004), 2003-371515, 2003-372323, and 2004-115048 are given.

Hereinafter, preferred embodiments of the invention will be described in detail according to drawings.

Embodiment 1

Figure 2:
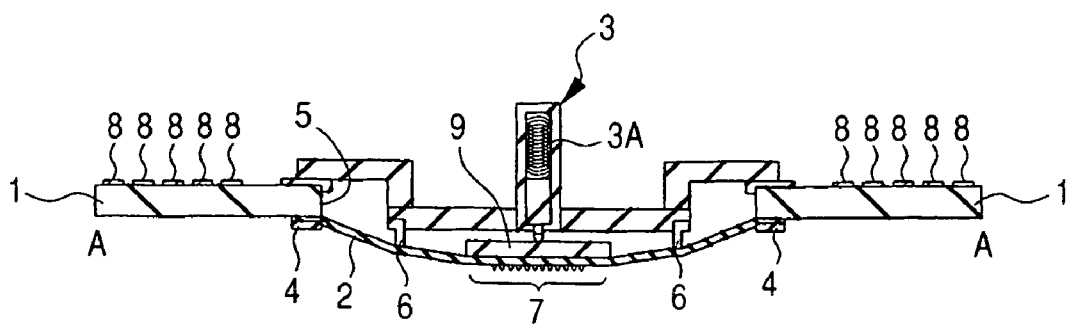
FIG. 2 shows a cross section view along a line A-A in FIG. 1.

FIG. 1 shows a relevant-part plane view of a bottom of a probe card of embodiment 1, and FIG. 2 is a cross section view along a line A-A in FIG. 1.

As shown in FIGS. 1 and 2, the probe card (first card) of the embodiment 1 is formed by a multilayer wiring board 1, membrane sheet (membrane probe (first sheet)) 2, and plunger (pressing mechanism) 3 and the like. The membrane sheet 2 is fixed to a bottom of the multilayer wiring board 1 by a holding ring 4, and the plunger 3 is attached to a top of the multilayer wiring board 1. An opening 5 is provided in the center of the multilayer wiring board 1, in which the membrane sheet 2 and the plunger 3 are adhered to each other via an adhesion ring 6.

On a bottom of the membrane sheet 2, a plurality of probes (contact terminals) 7 in a form of, for example, quadrangular pyramid or quadrangular pyramid trapezoid are formed. A plurality of wiring lines are formed in the membrane sheet 2, each of the wiring lines being electrically coupled to each of the probes 7, and extending from each of the probes 7 to a probing portion of the membrane sheet 2. A plurality of receiving parts (omitted to be shown) are formed over a bottom of the multilayer wiring board 1, each of which is to be electrically contacted to each of ends of the wiring lines, and the receiving parts are electrically coupled to a plurality of POGO bases 8 provided on a top of the multilayer wiring board 1 through a wiring line (first line) formed in the multilayer wiring board 1. The POGO bases 8 function to receive a pin for introducing a signal from a tester into the probe card.

In the embodiment 1, the membrane sheet 2 is formed of, for example, a membrane containing polyimide as a major component. Since such a membrane sheet 2 has softness, the embodiment 1 is in a structure where the plunger 3 presses the membrane sheet 2 in a region where the probes 7 are formed from a top (back) via a pressing tool (pressing mechanism) 9, in order to contact all the probes 7 to pads of a chip (semiconductor integrated circuit device). That is, constant pressure is applied to the pressing tool 9 by elastic force of a spring 3A disposed in the plunger 3. In the embodiment 1, 42-Alloy can be exemplified as a material of the pressing tool 9.

Figure 46:
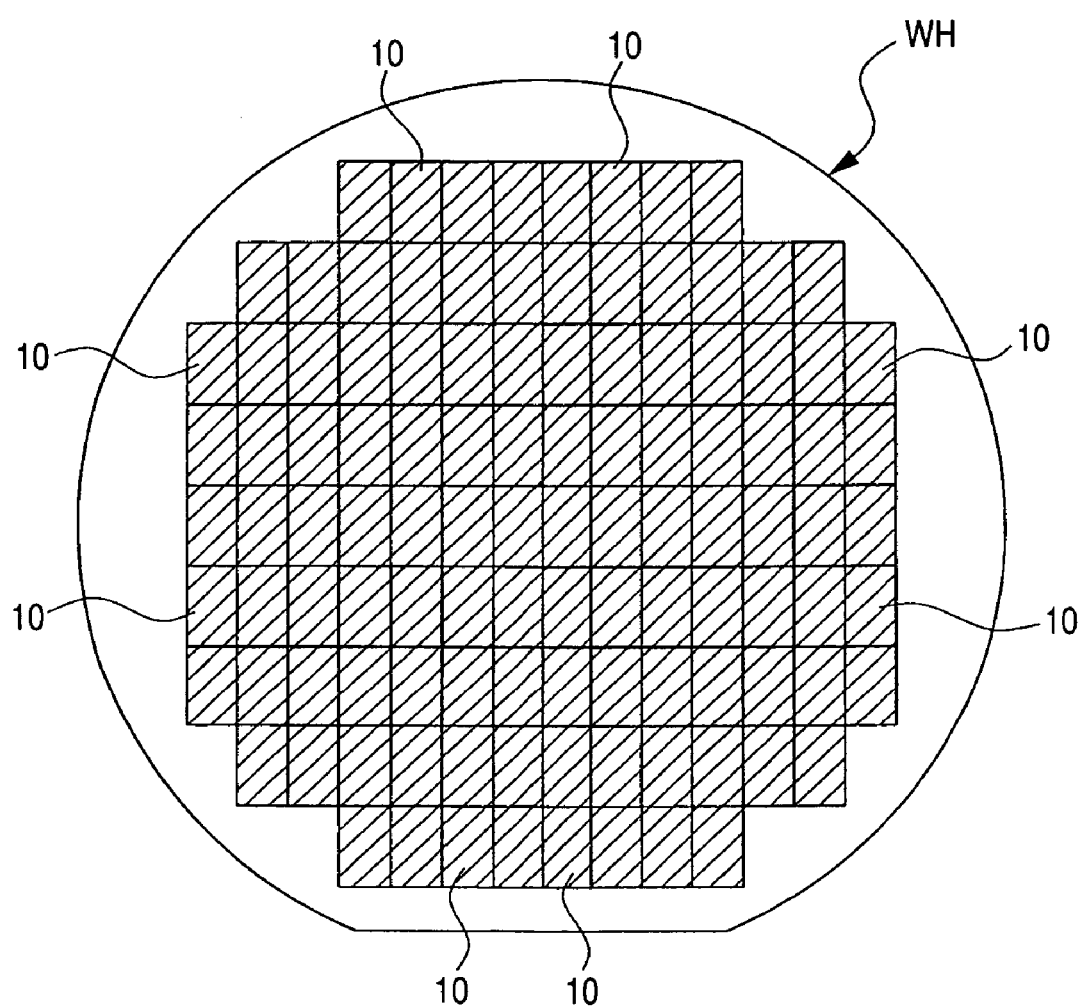
FIG. 46 is a plane view of a semiconductor wafer in which semiconductor chip regions are formed, the regions being as an object of a probe test using a probe card of the different embodiment of the invention.

In the embodiment 1, a chip having an LCD (Liquid Crystal Display) driver formed therein can be exemplified as an object of a probe test (electric test) using the probe card. FIG. 46 shows a plane view of a wafer WH in which the chips 10 (chip regions) are partitioned. The probe test using the probe card of the embodiment 1 is performed to the wafer in which the chips 10 are partitioned.

Figure 3:
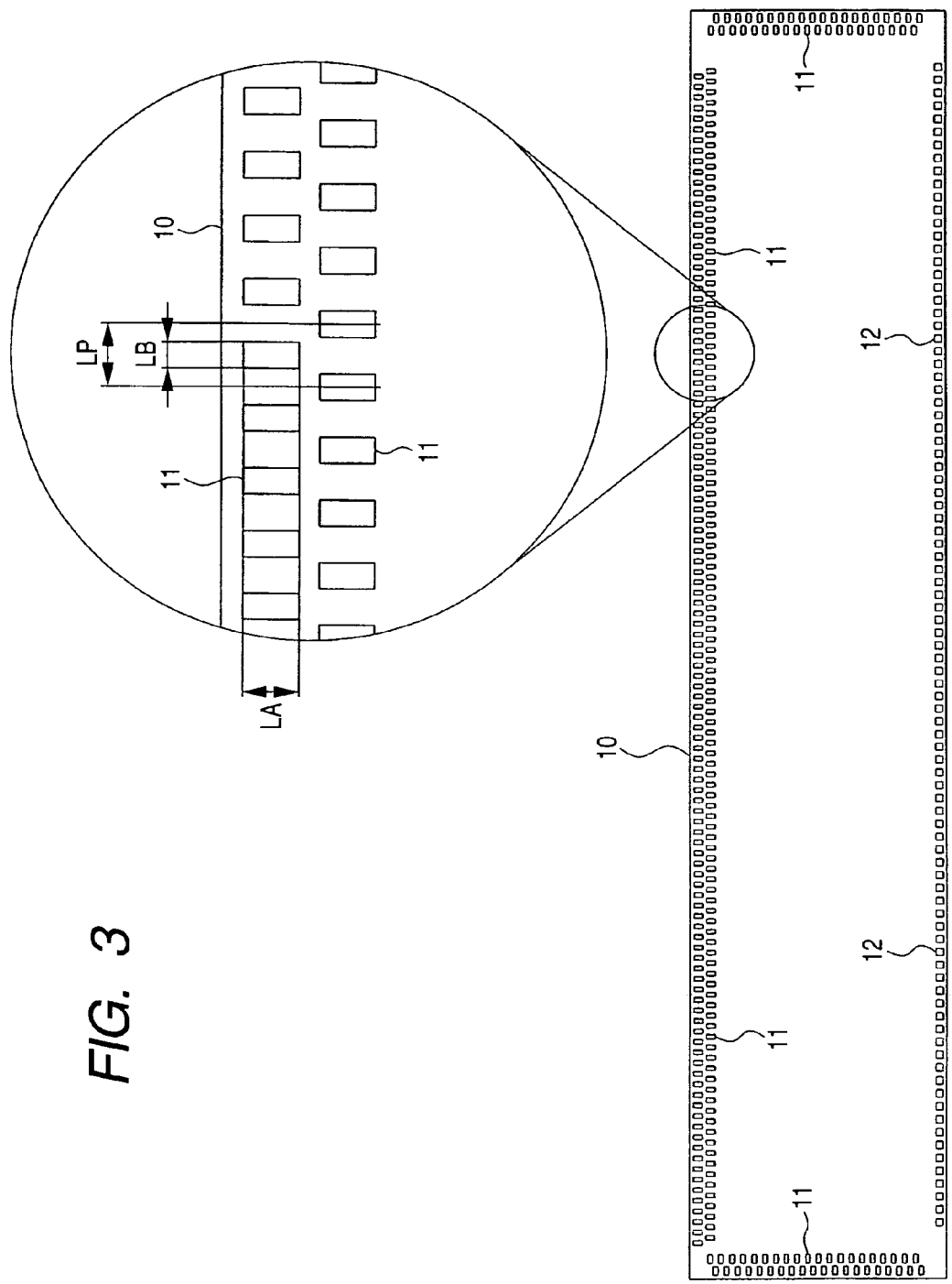
FIG. 3 shows a plane view of a semiconductor chip as an object of a probe test using the probe card of the embodiment of the invention.

FIG. 3 shows a plane of the chip 10, and a part of the chip in an enlarged manner. The chip 10 includes, for example, a single crystal silicon substrate, of which the main surface has an LCD driver circuit formed thereon. In a peripheral portion of the main surface of the chip 10, a number of pads (first electrodes) 11, 12 to be electrically coupled to the LCD driver circuit are disposed, in which the pads 11 arranged along an upper long side and two short sides of the chip 10 in FIG. 3 are output terminals, and the pads 12 arranged along a lower long side of the chip 10 are input terminals. Since the number of output terminals of the LCD driver is larger than the number of input terminals, the pads 11 are arranged in two lines along the upper long side and two short sides of the chip 10, and the pads 11 in respective lines are alternately arranged along the upper long side and two short sides of the chip 10, in order to increase an interval between adjacent pads 11 to the most. In the embodiment 1, a pitch (second distance) LP between adjacent pads 11 being arranged is, for example, about 68 µm. Moreover, in the embodiment 1, the pad 11 is in a planar rectangle shape, and length LA of the long side extending in a direction crossing (perpendicular to) the outer circumference of the chip 10 is about 63 µm, and length LB of the short side extending along the outer circumference of the chip 10 is about 34 µm. Since the pitch LP between adjacent pads 11 being arranged is about 68 µm, and the length LB of the short side of the pad 11 is about 34 µm, an interval between adjacent pads 11 is about 34 µm.

Figure 4:
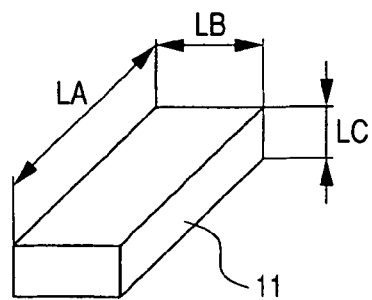
FIG. 4 shows a perspective view of a pad formed over the semiconductor chip shown in FIG. 3.

The pads 11 and 12 are bump electrodes (projection electrodes) formed of, for example, Au (gold), and formed over input/output terminals (bonding pads) of the chip 10 by a process of electroplating, electroless plating, evaporation, sputtering or the like. FIG. 4 is a perspective view of the pad 11. The pad 11 has height LC of about 15 µm, and the pad 12 has approximately the same height.

The chip 10 can be fabricated by forming the LCD driver circuits (semiconductor integrated circuits) and input/output terminals (bonding pads) using a semiconductor fabrication technique in the number of chip regions partitioned over the main surface of the wafer, then forming the pads 11 over the input/output terminals in the above method, and then dicing the wafer so that the chip regions are formed as individual pieces. In the embodiment 1, the probe test is performed to respective chip regions before dicing the wafer. When the probe test (a step that the pads 11, 12 are contacted to the probes 7) is described hereinafter, the chip 10 shows each chip region before dicing the wafer, in the case of being not particularly specified.

Figure 5:
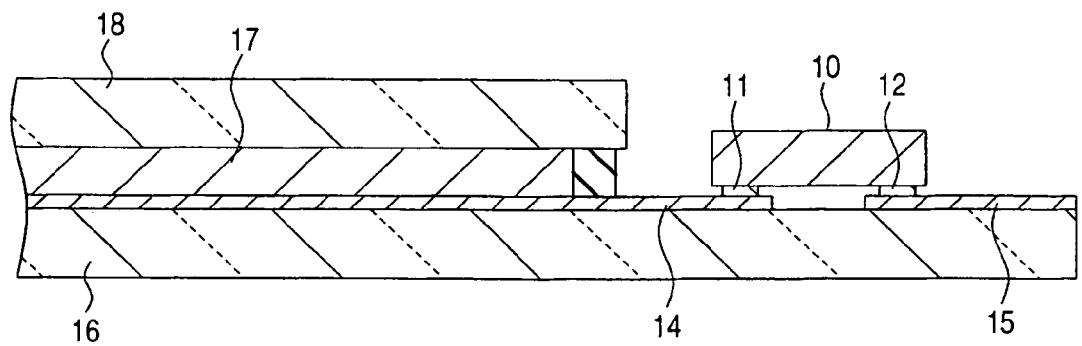
FIG. 5 shows a relevant-part section view showing a method of connecting the semiconductor chip shown in FIG. 4 to a liquid crystal panel.

FIG. 5 shows a relevant-part section view showing a method of connecting the chip 10 to a liquid crystal panel. As shown in FIG. 5, the liquid crystal panel is formed by a glass substrate 16 having pixel electrodes 14, 15 formed over its main surface, a liquid crystal layer 17, and a glass substrate 18 disposed in a manner of facing the glass substrate 16 via the liquid crystal layer 17. In the embodiment 1, it can be exemplified that the chip 10 is subjected to face-down bonding such that the pads 11, 12 are coupled to the pixel electrodes 14, 15 over the glass substrate 16 of such a liquid crystal panel, thereby the chip 10 is coupled to the liquid crystal panel.

Figure 6:
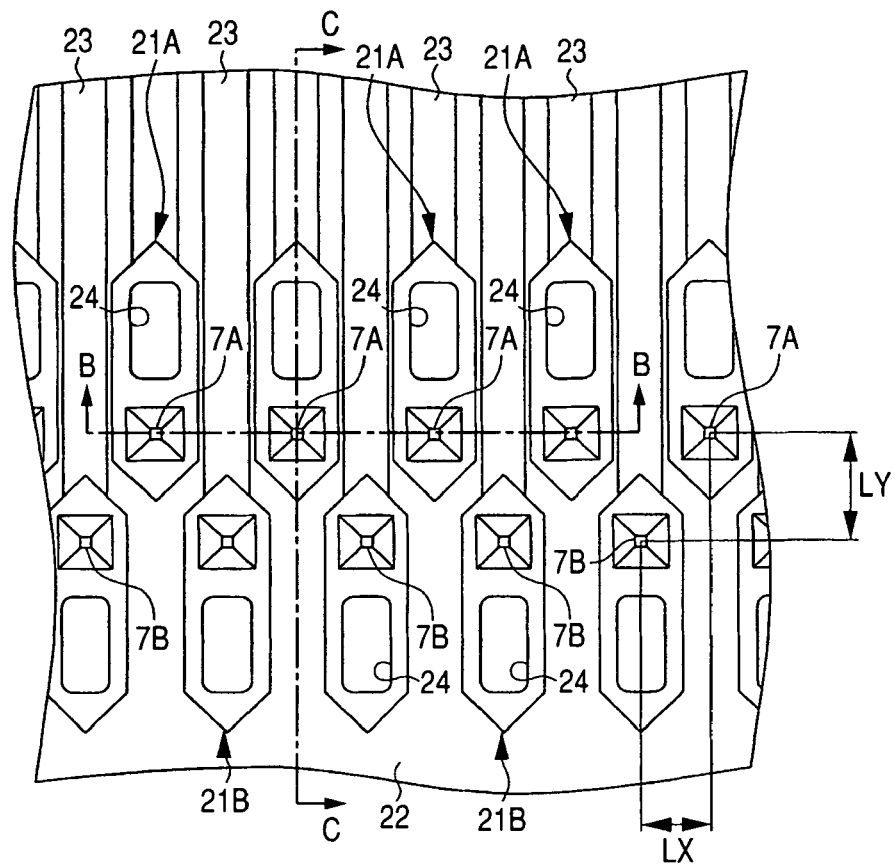
FIG. 6 shows a relevant-part plane view of a membrane sheet forming a probe card of the embodiment of the invention.
Figure 7:
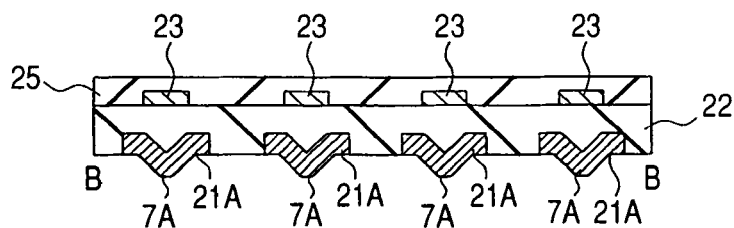
FIG. 7 shows a cross section view along a line B-B in FIG. 6.
Figure 8:
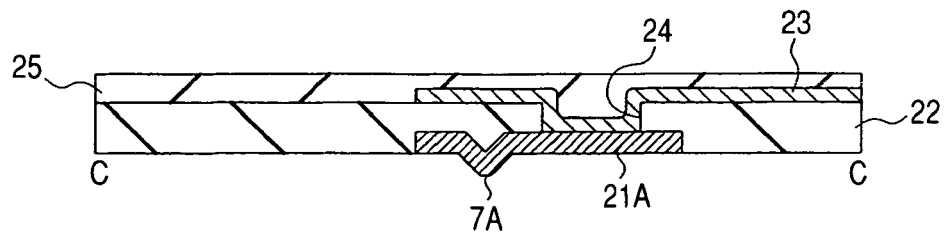
FIG. 8 shows a cross section view along a line C-C in FIG. 6.

FIG. 6 shows a relevant-part plane view showing a part of a region, in which the probes 7 over a bottom of the membrane sheet 2 are formed, in an enlarged manner; FIG. 7 shows a relevant-part section view along a line B-B in FIG. 6; and FIG. 8 shows a relevant-part section view along a line C-C in FIG. 6.

Figure 9:
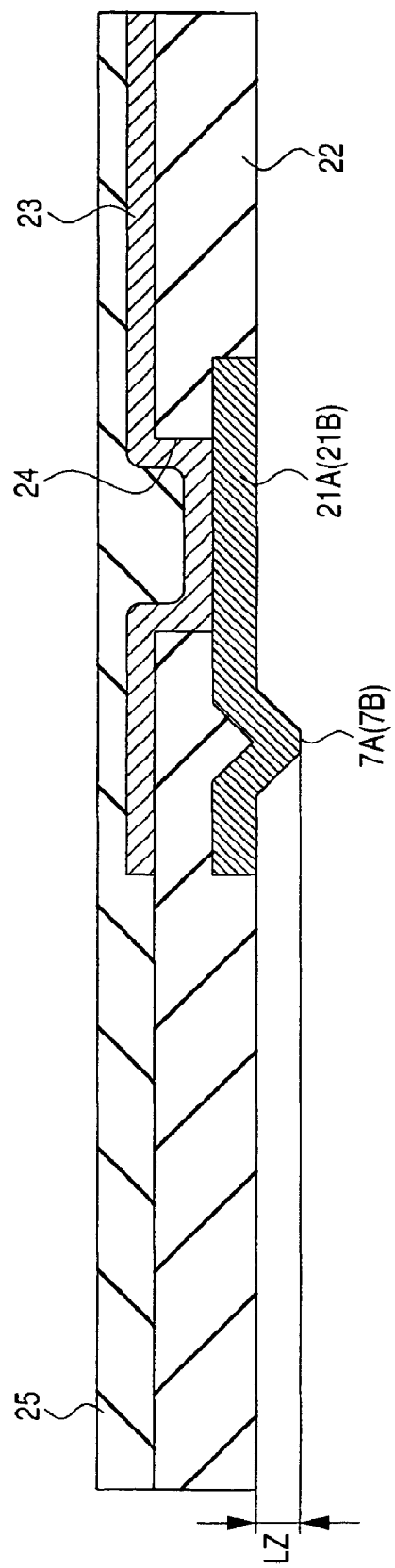
FIG. 9 shows a cross section view showing a relevant part of the membrane sheet forming the probe card of the embodiment of the invention.

The probes 7 are part of metal films 21A, 21B being patterned in a planar hexagon shape in the membrane sheet 2, and portions protruded in a quadrangular pyramid or quadrangular pyramid trapezoid shape in the bottom of the membrane sheet 2 in the metal films 21A, 21B. The probes 7 are disposed in the main surface of the membrane 2 in accordance with positions of the pads 11, 12 formed over the chip 10, and FIG. 6 shows arrangement of the probes 7 corresponding to the pads 11. Among the probes 7, probes 7A correspond to pads 11 in a line (hereinafter, referred to as first line) relatively near the outer circumference of the chip 10 in the pads 11 arranged in two lines, and probes 7B correspond to pads 11 in a line (hereinafter, referred to as second line) relatively distant from the outer circumference of the chip 10 in the pads 11 arranged in two lines. A distance between a probe 7A and a probe 7B situated nearest to each other is defined by a horizontal distance LX and a vertical distance LY on a paper on which FIG. 6 is depicted, and the distance LX is 34 μm that is half the pitch LP between the adjacent pads 11 being arranged. In the embodiment 1, the distance LY is about 93 μm. As shown in FIG. 9, heights LZ (needle height) from a surface of a polyimide film 22 to ends of the probes 7A, 7B are uniformly made to be 50 μm or less (at most 90 μm or less), and further desirably 30 μm or less.

The metal films 21A, 21B are formed, for example, by sequentially stacking a rhodium film and a nickel film from a lower layer. The polyimide film 22 is formed over the metal films 21A, 21B, and wiring lines (second lines) 23 to be electrically coupled to respective metal films 21 are formed over the polyimide film 22. The wiring lines 23 are contacted to the metal films 21A, 21B at bottoms of throughholes 24 formed in the polyimide film 22. A polyimide film 25 is formed over the polyimide film 22 and the wiring lines 23.

As described before, part of the metal films 21A, 21B are formed into the probes 7A, 7B formed in the quadrangular pyramid or quadrangular pyramid trapezoid shape, and the throughholes 24 penetrating to the metal films 21A, 21B are formed in the polyimide film 22. Therefore, when a planar pattern of the metal films 21A having the probes 7A formed therein and the throughholes 24, and a planar pattern of the metal films 21B having the probes 7B formed therein and the throughholes 24 are disposed in the same direction, a trouble may anxiously occur, the trouble being a trouble that a metal film 21A and a metal film 21B adjacent to each other are contacted to each other, consequently input and output can not be obtained independently from the probes 7A and 7B. Thus, in the embodiment 1, as shown in FIG. 6, the planar pattern of the metal films 21B having the probes 7B formed therein and the throughholes 24 corresponds to a pattern made by rotating the planar pattern of the metal films 21A having the probes 7A formed therein and the throughholes 24 by 180 degrees. Thereby, wide regions of the metal films 21A having the probes 7A and the throughholes 24 disposed therein in a plane, and wide regions of the metal films 21B having the probes 7B and the throughholes 24 disposed therein in a plane are not disposed over a straight line in a left and right direction on paper, and planar, forward tapered regions of the metal films 21A and the metal films 21B are disposed over the straight line in the left and right direction on paper. As a result, the trouble of contact between the metal film 21A and the metal film 21B adjacent to each other can be prevented. Moreover, even if the pads 11 (see FIG. 3) are disposed at a narrow pitch, the probes 7A and 7B can be disposed in positions corresponding to the pads.

Figure 10:
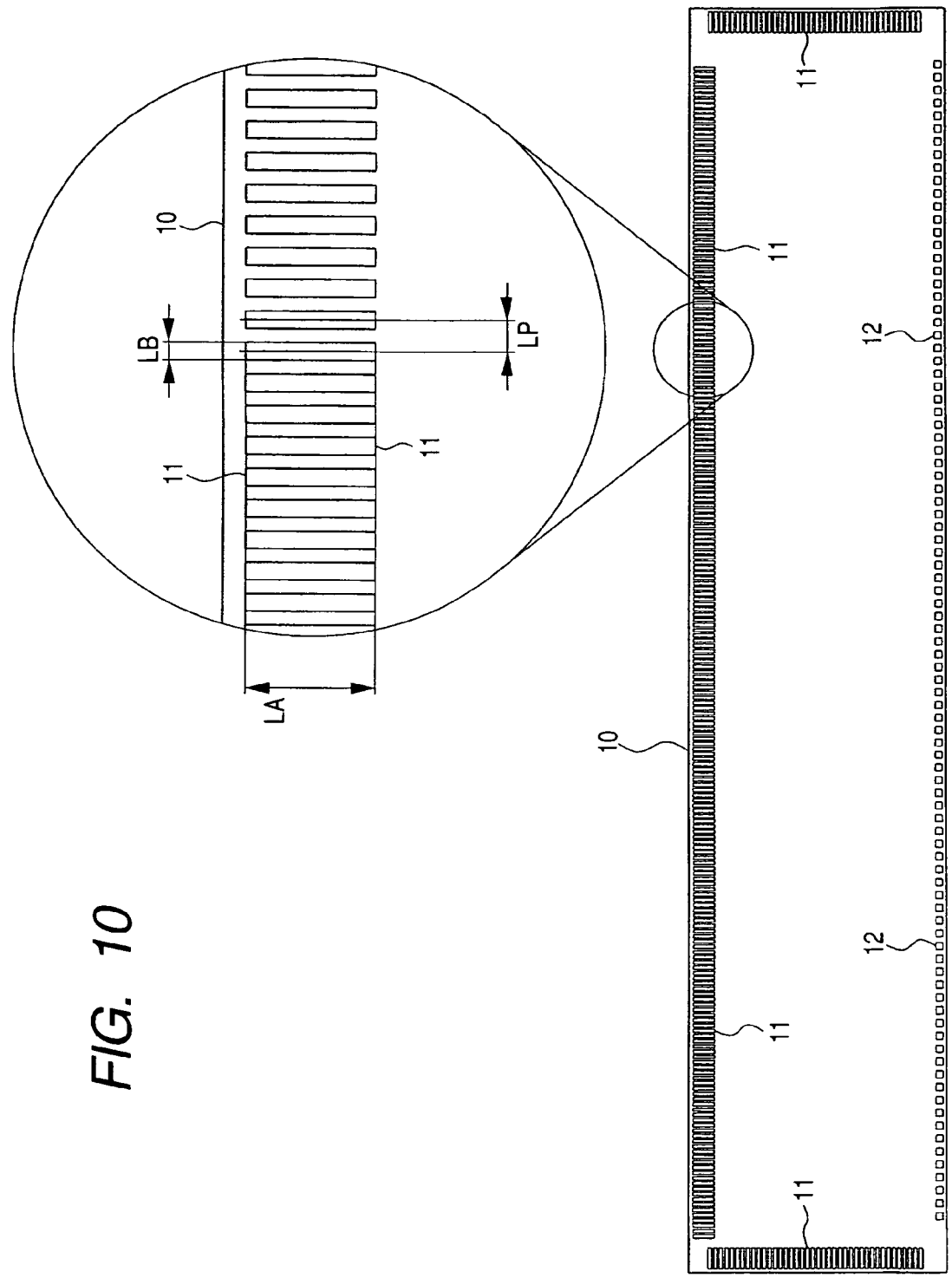
FIG. 10 shows a plane view of a semiconductor chip as an object of a probe test using the probe card of the embodiment of the invention.
Figure 11:
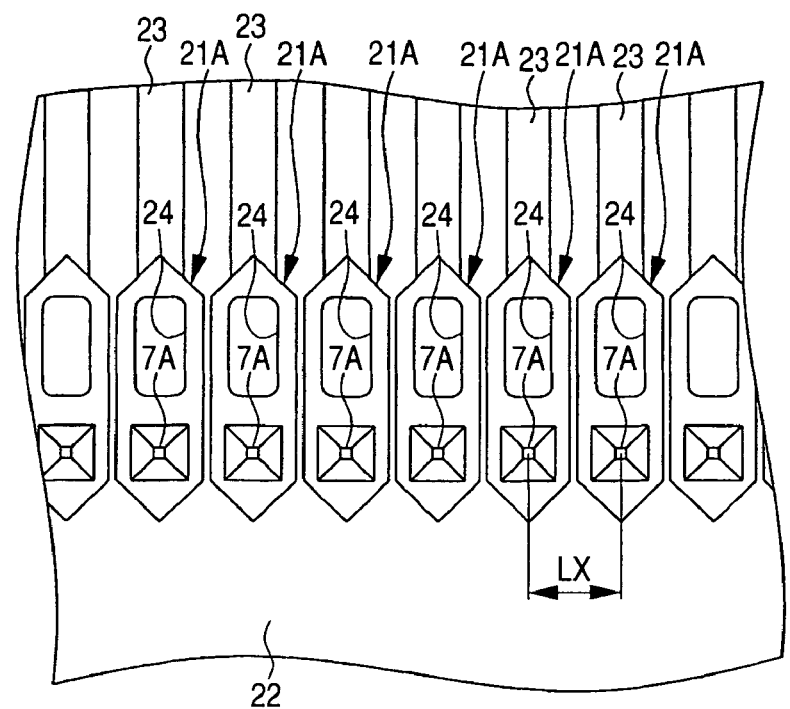
FIG. 11 shows a relevant-part plane view of a membrane sheet for forming a probe card of the embodiment of the invention.
Figure 12:
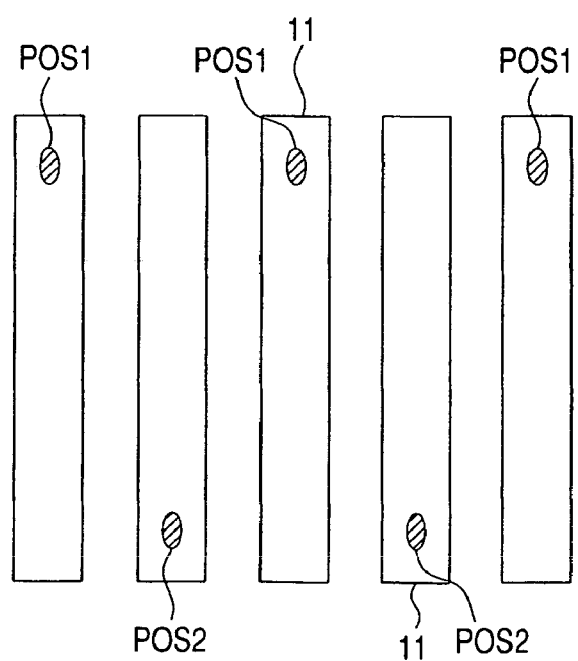
FIG. 12 shows a relevant-part plane view showing a probe contact position, at which probes contact to bump electrodes, on the bump electrodes provided on a semiconductor chip as an object of a probe test using a probe card of the embodiment of the invention.

While the case that the pads 11 are arranged in two lines were described using FIG. 3 in the embodiment 1, there is a chip on which pads are arranged in one line as shown in FIG. 10. Such a chip can be coped with by using a membrane sheet 2 in which the wide regions of the metal films 21A are disposed over a straight line in a left and right direction over paper as shown in FIG. 11. When the pads 11 are arranged in one line in this way, and for example, the length LA of the long side extending in the direction crossing (perpendicular to) the outer circumference of the chip 10 is about 140 μm, the length LB of the short side extending along the outer circumference of the chip 10 is about 19 μm, the pitch LP between adjacent pads 11 being disposed is about 34 μm, and the interval between adjacent pads 11 is about 15 μm, length of a long side is approximately two times or more compared with the pads 11 shown in FIG. 3, and central positions of the pads 11 in a short side direction can be aligned with central positions of the pads 11 shown in FIG. 3, therefore the membrane sheet 2 described using FIGS. 6 to 8 can be used, and consequently the probes 7A, 7B are contacted to the pads 11 at positions POS1, POS as shown in FIG. 12, respectively.

Figure 13:
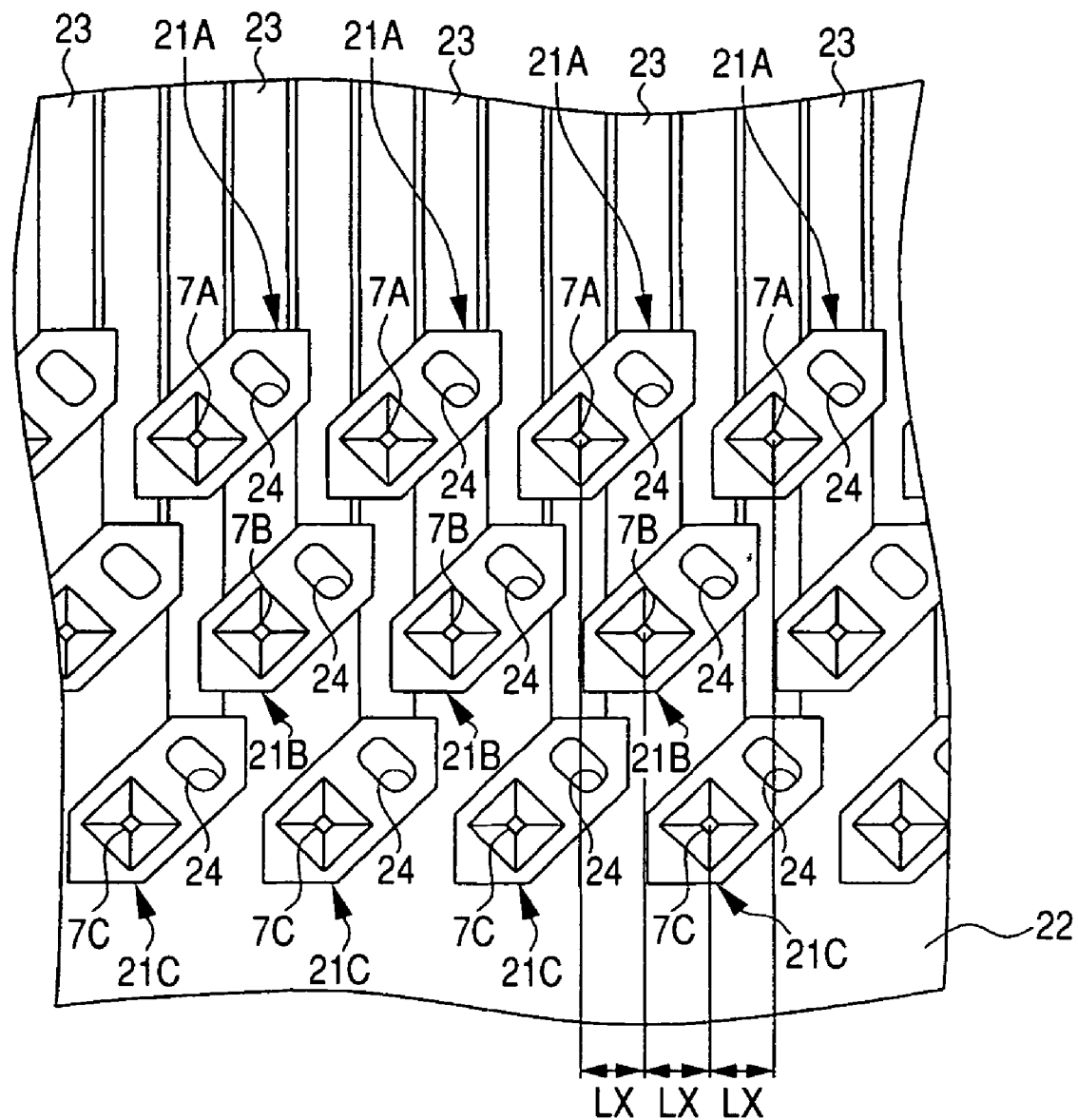
FIG. 13 shows a relevant-part plane view of a membrane sheet for forming a probe card of the embodiment of the invention.
Figure 14:
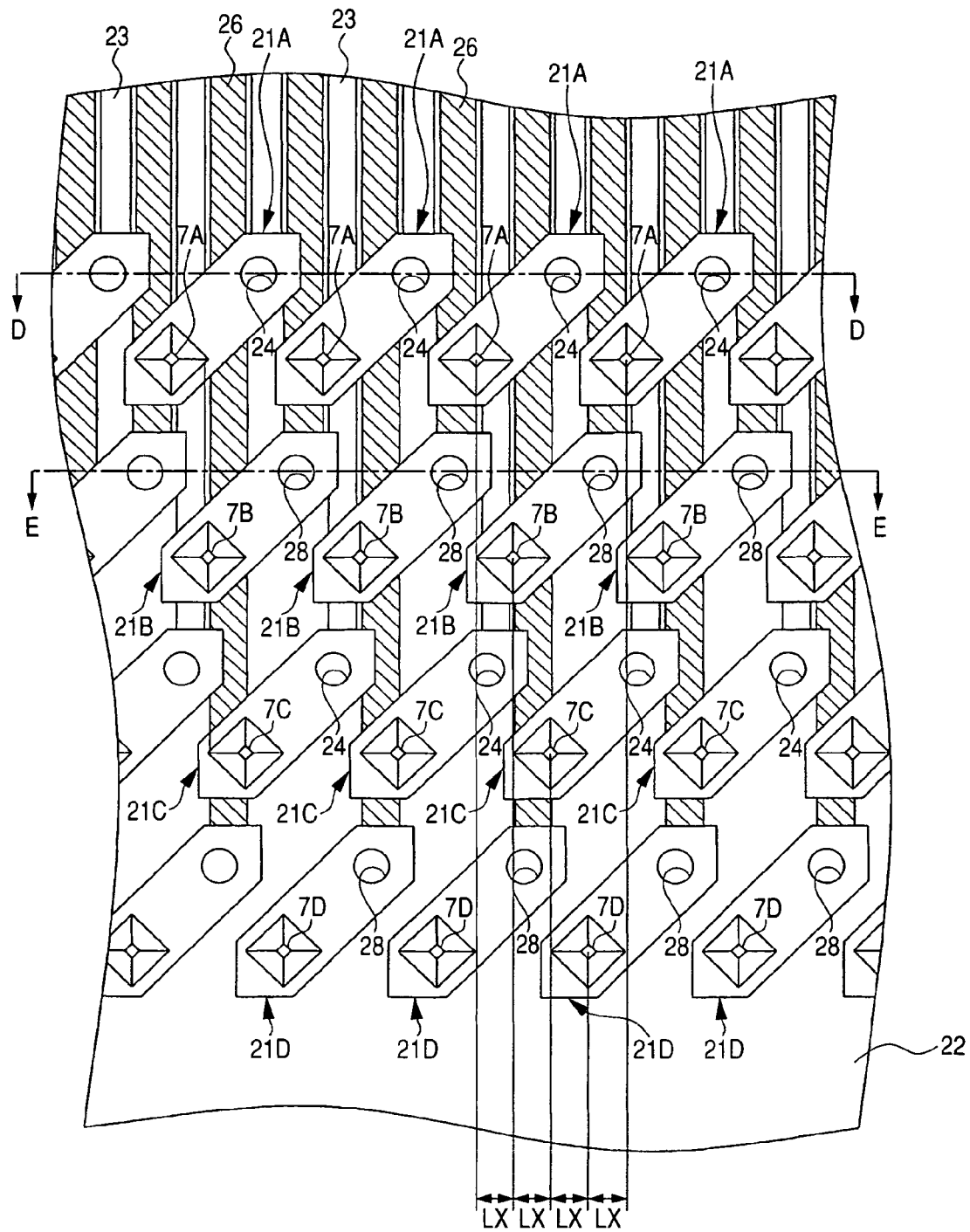
FIG. 14 shows a relevant-part plane view of a membrane sheet for forming a probe card of the embodiment of the invention.

When further large number of the pads 11 is given, the pads are sometimes arranged in at least 3 lines. FIG. 13 shows a relevant-part plane view of a membrane sheet 2 corresponding to pads 11 arranged in 3 lines, and FIG. 14 shows a relevant-part plane view of a membrane sheet 2 corresponding to pads 11 arranged in 4 lines. When size of the chip 10 is the same, as the line number of pads 11 is increased, the distance LX described using FIG. 6 becomes further narrower, therefore it is further anxious that metal films including the metal films 21A, 21B may be contacted to one another. Thus, as shown in FIGS. 13 and 14, metal films 21A, 21B, 21C and 21D are made in a pattern formed by rotating a planar pattern of the metal film 21A shown in FIG. 6 by 45 degrees, thereby a trouble that the metal films 21A, 21B, 21C and 21D are contacted to one another can be prevented. Moreover, while an example that the planar pattern of the metal film 21A shown in FIG. 6 was rotated by 45 degrees was described here, a rotation angle is not limited to 45 degrees, and may be another angle if contact between the metal films 21A, 21B, 21C and 21D can be prevented. Probes 7C are formed in the metal films 21C, probes 7C being corresponding to pads 11 disposed in further inner side in the chip 10 with respect to pads 11 to which the probes 7B are corresponding, and probes 7D are formed in the metal films 21D, the probes 7D being corresponding to pads 11 disposed in further inner side of the chip 10 with respect to pads 11 to which the probes 7C are corresponding.

Figure 15:
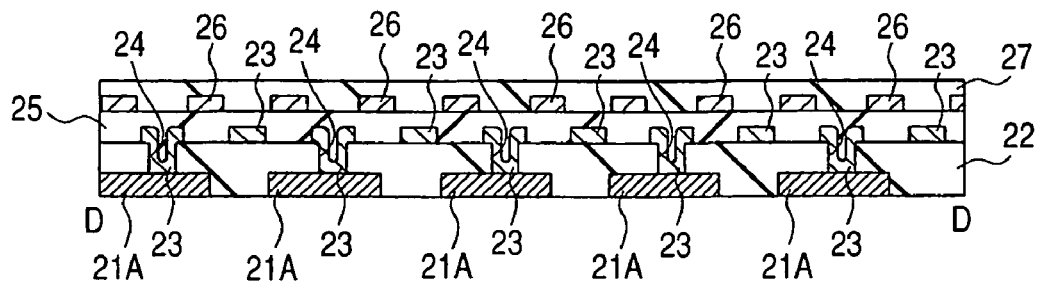
FIG. 15 shows a cross section view along a line D-D in FIG. 14.
Figure 16:
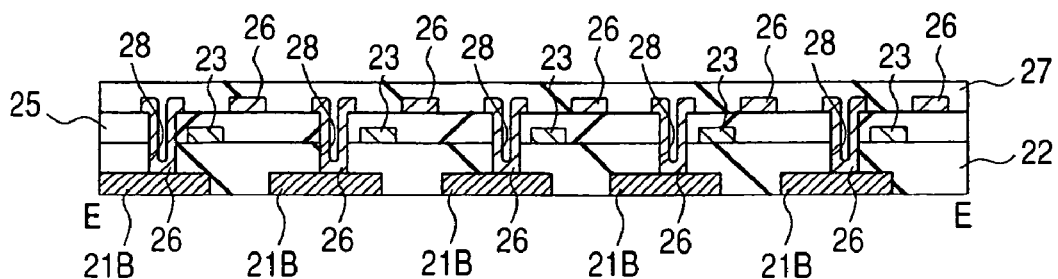
FIG. 16 shows a cross section view along a line E-E in FIG. 14.

Here, FIG. 15 shows a relevant-part section view along a line D-D in FIG. 14, and FIG. 16 shows a relevant-part section view along a line E-E in FIG. 14. As shown in FIG. 14, when the metal films 21A to 21D having the probes 7A to 7D corresponding to the pads 11 in 4 lines are disposed, all of wiring lines to be electrically coupled to the respective metal films 21A to 21D from an upper layer are hard to be formed by one wiring layer. This is because the distance LX is decreased, thereby the metal films 21A to 21D may be contacted to one another, in addition, wiring lines to be electrically coupled to the metal films 21A to 21D may be contacted to one another. Thus, in the embodiment 1, it can be exemplified that the wiring lines are formed of two wiring layers (wiring lines 23, 26), as shown in FIGS. 15 and 16. A polyimide film 27 is formed over the wiring line 26 and a polyimide film 25. The wiring lines 23 as a relatively lower layer are contacted to the metal films 21A, 21C at bottoms of throughholes 24 formed in the polyimide films 22, and the wiring lines 26 as a relatively higher layer are contacted to the metal films 21B, 21D at bottoms of throughholes 28 formed in the polyimide films 22, 25. Since a large interval between adjacent wiring lines 23 or wiring lines 26 can be secured in the same wiring layer thereby, a trouble that the adjacent wiring lines 23 or wiring lines 26 are contacted to each other can be prevented. When pads 11 in 5 lines or more are given, and the number of corresponding probes is increased and thus the distance LX is reduced, a wiring interval may be increased by forming more wiring layers.

Next, a structure of the membrane sheet 2 of the embodiment 1 is described using FIGS. 17 to 26 in conjunction with a fabrication process of the membrane sheet. FIGS. 17 to 26 show relevant-part section views during a fabrication process of the membrane sheet 2 having the probes 7A, 7B corresponding to the pads 11 in two lines (see FIG. 3) described using FIGS. 6 to 8. A structure and a fabrication process of the membrane sheet, and a structure and a fabrication process of probes similar to the probes 7 (probes 7A to 7D) are described also in Japanese Patent Applications No. 2003-75429, No. 2003-371515, No. 2003-372323, and No. 2004-115048.

Figure 17:
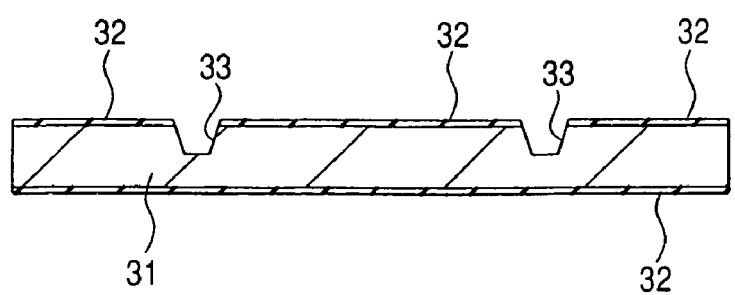
FIG. 17 shows a relevant-part section view for explaining a fabrication process of the membrane sheet forming the probe card of the embodiment of the invention.

First, as shown in FIG. 17, a wafer 31 including silicon about 0.2 mm to 0.6 mm in thickness is prepared, and silicon oxide films 32 having a thickness of about 0.5 μm are formed over both sides of the wafer 31 by a thermal oxidation process. Next, a silicon oxide film 32 at a side of the main surface of the wafer 31 is etched using a photoresist film as a mask, so that openings penetrating to the wafer 31 are formed in the silicon oxide film 32 at the main surface side of the wafer 31. Then, the wafer 31 is anisotropically etched using a strong alkaline solution (for example, potassium hydroxide solution) with a remained silicon oxide film 32 as a mask, thereby holes 33 in a quadrangular pyramid or quadrangular pyramid trapezoid shape enclosed by (111) faces are formed in the main surface of the wafer 31.

Figure 18:
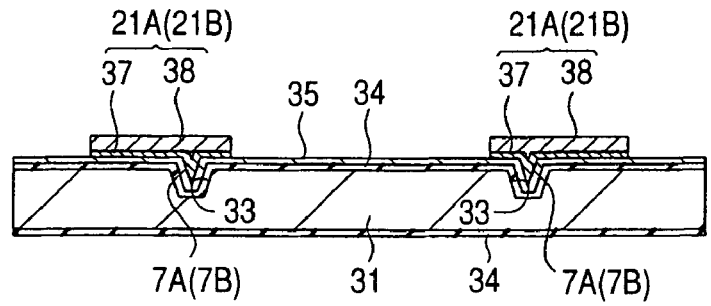
FIG. 18 shows a relevant-part section view during the fabrication process of the membrane sheet following FIG. 17.

Next, as shown in FIG. 18, the silicon oxide film 32 used as the mask during formation of the holes 33 are removed by wet etching using a mixed solution of hydrofluoric acid and ammonium fluoride. Then, the wafer 31 is subjected to thermal oxidation treatment, thereby a silicon oxide film 34 having a thickness of about 0.5 μm is formed over the whole surface of the wafer 31 including insides of the holes 33. Then, a conductive film 35 is formed over the main surface of the wafer 31 including the insides of the holes 33. The conductive film 35 can be formed, for example, by sequentially depositing a chromium film having a thickness of about 0.1 μm and a copper film having a thickness of about 1 μm by a sputtering or evaporation process. Then, a photoresist film is formed over the conductive film 35, and a photoresist film in a region, in which the metal films 21A, 21B (see FIGS. 6 to 8) are formed in a later step, is removed by a photolithography technique, so that openings are formed.

Next, conductive films 37 and 38 having high hardness are sequentially deposited over the conductive film 35 appearing in bottoms of the openings in the photoresist film by an electroplating process using the conductive film 35 as an electrode. In the embodiment 1, it can be exemplified that the conductive film 37 is a rhodium film, and the conductive film 38 is a nickel film. According to the steps so far, the metal films 21A, 21B can be formed from the conductive films 37, 38. Conductive films 37 and 38 in the holes 33 will be the probes 7A, 7B. The conductive film 35 is removed in a later step, which is described later.

In the metal films 21A and 21B, when the probes 7A and 7B are formed in a later step, the conductive films 37 formed of the rhodium film become surface films, which are directly contacted to the pads 11. Therefore, a material having high hardness and excellent wear resistance is preferably selected for the conductive films 37. Moreover, since the conductive films 37 are directly contacted to the pads 11, when dust of the pads 11 shaven off by the probes 7A and 7B is adhered to the conductive films 37, a cleaning step for removing the dust is necessary, which anxiously leads to increase in time of a probe test step. Therefore, a material being hardly adhered with a material forming the pads 11 is preferably selected for the conductive films 37. Thus, in the embodiment 1, the rhodium film satisfying these conditions is selected as the conductive film 37. The cleaning step can be thus omitted.

Figure 19:
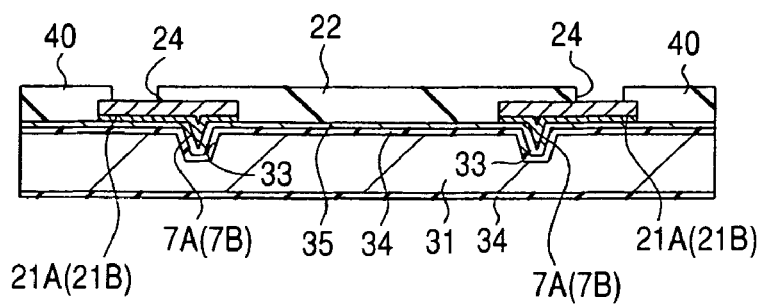
FIG. 19 shows a relevant-part section view during the fabrication process of the membrane sheet following FIG. 18.

Next, the photoresist film used for formation of the metal films 21A, 21B (conductive films 37, 38) is removed, then the polyimide film 22 (see also FIGS. 7 and 8) is formed such that it covers the metal films 21A, 21B and the conductive film 35 as shown in FIG. 19. Then, the throughholes 24 penetrating to the metal films 21A, 21B are formed in the polyimide film 22. The throughholes 24 can be formed by drilling using laser or dry etching using an aluminum film as a mask.

Figure 20:
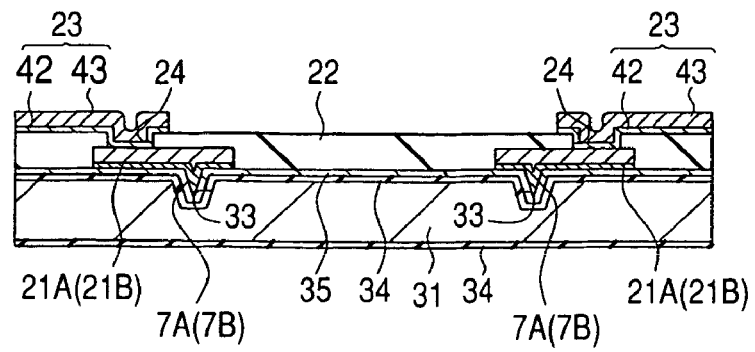
FIG. 20 shows a relevant-part section view during the fabrication process of the membrane sheet following FIG. 19.

Next, as shown in FIG. 20, a conductive film 42 is formed over the polyimide film 22 including the insides of the throughholes 24. The conductive film 42 can be formed, for example, by sequentially depositing a chromium film having a thickness of about 0.1 μm and a copper film having a thickness of about 1 μm by the sputtering or evaporation process. Then, a photoresist film is formed over the conductive film 42, and then the photoresist film is patterned by the photolithography technique, so that openings penetrating to the conductive film 42 are formed in the photoresist film. Then, a conductive film 43 is formed over the conductive film 42 in the openings by a plating process. In the embodiment 1, a copper film, or a stacked film formed by sequentially depositing a copper film and a nickel film from a lower layer can be exemplified as the conductive film 43.

Next, the photoresist film is removed, and then the conductive film 42 is etched using the conductive film 43 as a mask, thereby wiring lines 23 including the conductive films 42, 43 are formed. The wiring lines 23 can be electrically coupled to the metal films 21A, 21B at bottoms of the throughholes 24.

Figure 21:
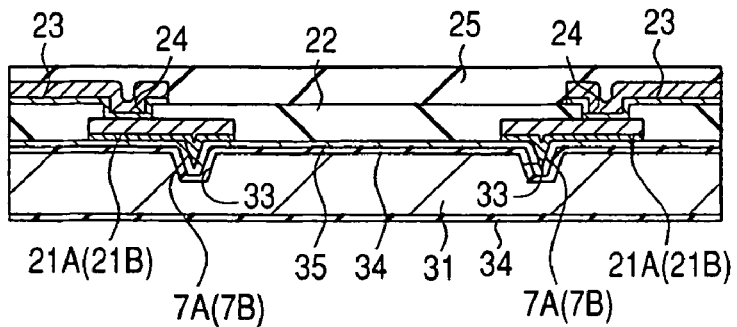
FIG. 21 shows a relevant-part section view during the fabrication process of the membrane sheet following FIG. 20.

Next, as shown in FIG. 21, the polyimide film 25 is formed over the main surface of the wafer 31. The polyimide film 25 functions as an adhesive layer of a metal sheet to be adhered to the main surface of the wafer 31 in a later step.

Figure 22:
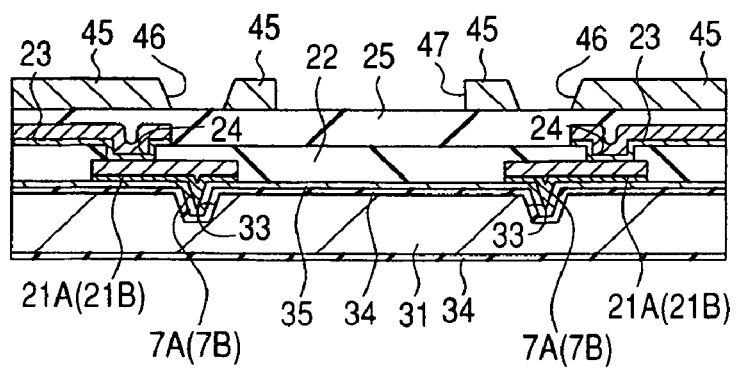
FIG. 22 shows a relevant-part section view during the fabrication process of the membrane sheet following FIG. 21.

Next, as shown in FIG. 22, a metal sheet 45 is adhered to a top of the polyimide film 25. For the metal sheet 45, a material of which the linear expansion coefficient is low and close to that of the wafer 31 formed of silicon, and in the embodiment 1, 42-Alloy (an alloy of nickel of 42% and iron of 58% having linear expansion coefficient of 4 ppm/° C.) or invar (an alloy of nickel of 36% and iron of 64% having linear expansion coefficient of 1.5 ppm/° C.) can be exemplified. Moreover, a silicon film having the same material as that of the wafer 31 may be formed instead of using the metal sheet 45, or a material having approximately the same linear expansion coefficient as that of silicon such as an alloy of iron, nickel, and cobalt, or a mixed material of ceramic and resin may be formed. Adhesion of such a metal sheet 45 can be realized by overlapping the metal sheet with the main surface of the wafer 31 while aligning them with each other, then heating them at a temperature of the glass transition point of the polyimide film 25 or more while pressing them at about 10 to 200 kgf/cm² to perform thermocompression bonding.

Such a metal sheet 45 is adhered using the polyimide film 25, thereby strength of the membrane sheet 2 to be formed can be improved. When the metal sheet 45 is not adhered, a trouble may anxiously occur, the trouble being a trouble that relative positions between the probes 7A, 7B and the pads 11 are displaced by expansion or shrinkage of the membrane sheet 2 and the wafer as a test object due to temperature during the probe test, consequently the probes 7A, 7B can not be contacted to corresponding pads 11. On the other hand, according to the embodiment 1, levels of the expansion or shrinkage of the membrane sheet 2 and the wafer as the test object due to temperature during the probe test can be made uniform by adhesion of the metal sheet 45. The relative positions between the probes 7A, 7B and the pads 11 can be prevented from being displaced thereby. That is, electrical contact between the probes 7A, 7B and the corresponding pads 11 can be secured at any time irrespective of temperature during the probe test. Moreover, relative, positional system between the membrane sheet 2 and the wafer as the test object can be secured under various situations.

Next, the metal sheet 45 is etched using a photoresist film patterned by the photolithography technique as a mask, thereby openings 46 are formed in the metal sheet 45 over the probes 7A, 7B, and openings 47 are formed in the metal sheet 45 on regions between the metal films 21A, or the metal films 21B in a plane. In the embodiment 1, the etching may be spray etching using a ferric chloride solution.

Figure 23:
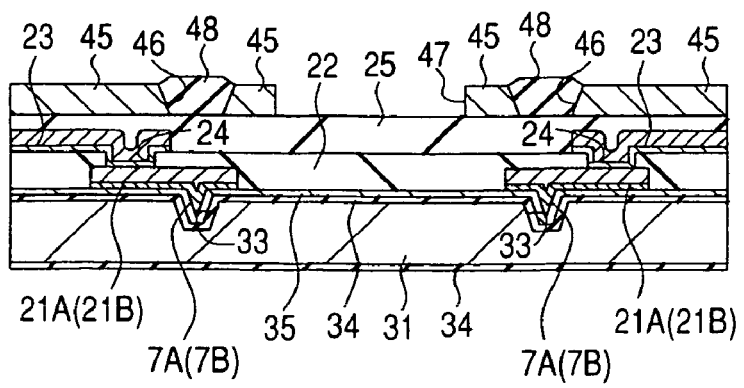
FIG. 23 shows a relevant-part section view during the fabrication process of the membrane sheet following FIG. 22.

Next, the photoresist film is removed, and then elastomer portions 48 are formed in the openings 46 as shown in FIG. 23. At that time, the elastomer portions 48 are formed such that a certain amount of elastomer appears above the openings 46. In the embodiment 1, as a method of forming the elastomer portions 48, a method of printing or dispenser-coating elastic resin in the openings 46, or a method of setting a silicon sheet can be exemplified. The elastomer portions 46 absorb variation in height of ends of individual probes 7A, 7B by local deformation while reducing shock when the ends of many probes 7A, 7B are contacted to the pads 11, consequently contact between the probes 7A, 7B and the pads 11 is realized by uniform biting following variation in height of the pads 11.

Figure 24:
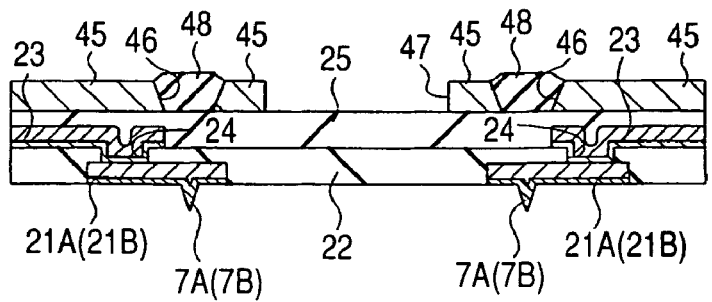
FIG. 24 shows a relevant-part section view during the fabrication process of the membrane sheet following FIG. 23.

Next, as shown in FIG. 24, the silicon oxide film 34 on a back of the wafer 31 is removed by etching using the mixed solution of hydrofluoric acid and ammonium fluoride. Then, the wafer 31 as a mold material for forming the membrane sheet 2 is removed by etching using a strong alkaline solution (for example, potassium hydroxide solution). Then, the silicon oxide film 34 and the conductive film 35 are sequentially removed by etching. At that time, the silicon oxide film 34 is etched using the mixed solution of hydrofluoric acid and ammonium fluoride, and the chromium film included in the conductive film 35 is etched using a potassium permanganate solution, and a copper film included in the conductive film 35 is etched using an alkaline copper etchant. According to the steps so far, the rhodium films as the conductive films 37 (see FIG. 18) forming the probes 7A, 7B appear over surfaces of the probes 7A, 7B. As described before, the probes 7A, 7B having the rhodium films formed over the surfaces is hardly adhered with Au or the like as a material of the pads 11 to be contacted with the probes 7A, 7B, and is high in hardness compared with Ni, and hardly oxidized and therefore able to stabilize contact resistance.

Figure 25:
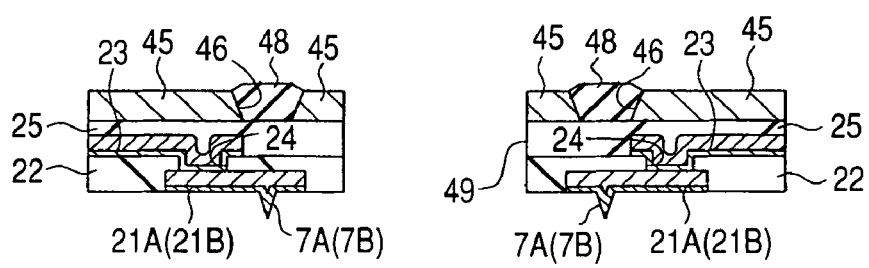
FIG. 25 shows a relevant-part section view during the fabrication process of the membrane sheet following FIG. 24.
Figure 26:
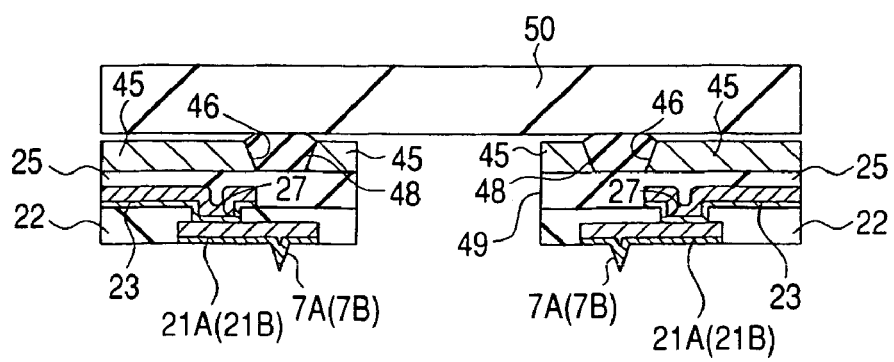
FIG. 26 shows a relevant-part section view during the fabrication process of the membrane sheet following FIG. 25.

Next, as shown in FIG. 25, the polyimide films 25, 22 under the opening 47 are removed to form an opening 49. The opening 49 can be formed by drilling using laser or dry etching using the metal sheets 45 and the elastomer 48 as a mask. Then, as shown in FIG. 26, a pressing tool 50 formed of 42-Alloy or the like is adhered over the elastomer portions 48, thereby the membrane sheet 2 of the embodiment 1 is fabricated.

Figure 27:
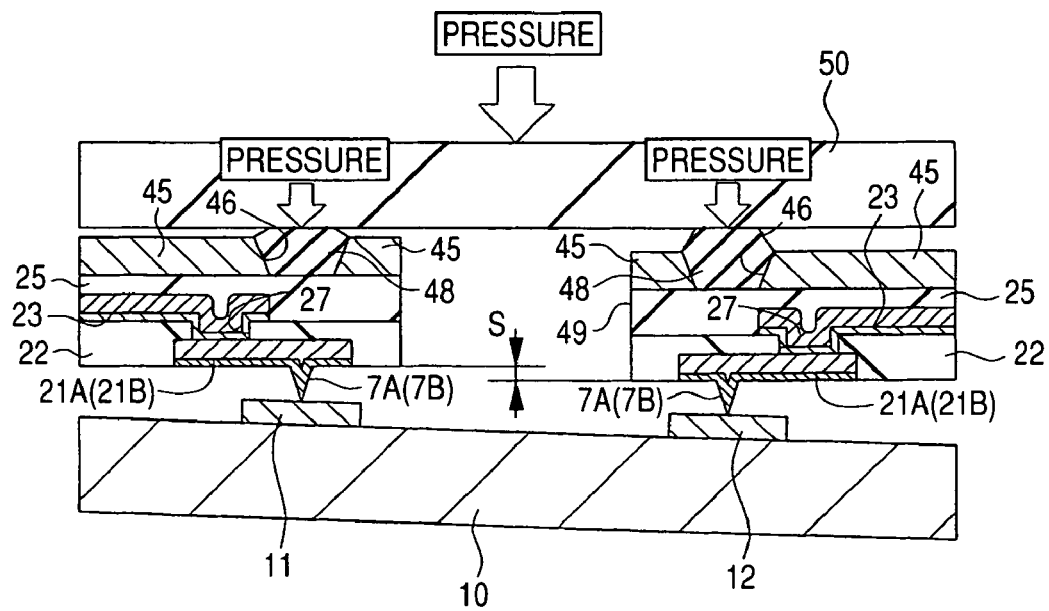
FIG. 27 shows a relevant-part section view for explaining contact between probes and pads of a semiconductor chip, the probes being included by the membrane sheet forming the probe card of the embodiment of the invention.

The membrane sheet 2 of the embodiment 1 fabricated according to the above steps is improved in stiffness by the metal sheet 45 adhered thereto. Moreover, as shown in FIG. 27, warp in a wafer (chip 10) as a test object causes difference S in height between the pads 11 and the pads 12. Therefore, such difference S anxiously causes a trouble that probes 7A, 7B can not be contacted to the pads 12 having relatively low height. However, the opening 49 is formed in the metal films 21A (in the metal films 21B), which reduces stiffness of the membrane sheet 2 in the opening 49. Thereby, when the membrane sheet is applied with pressure by the pressing tool 50 during the probe test, the membrane sheet 2 is also allowed to have a step in the opening 49 within a range of elastic deformation of the elastomer 48 or the like. As a result, since such steps that cancel the difference S can be produced in the membrane sheet 2, all the probes 7A, 7B can be securely contacted to the pads 11, 12.

Figure 28:
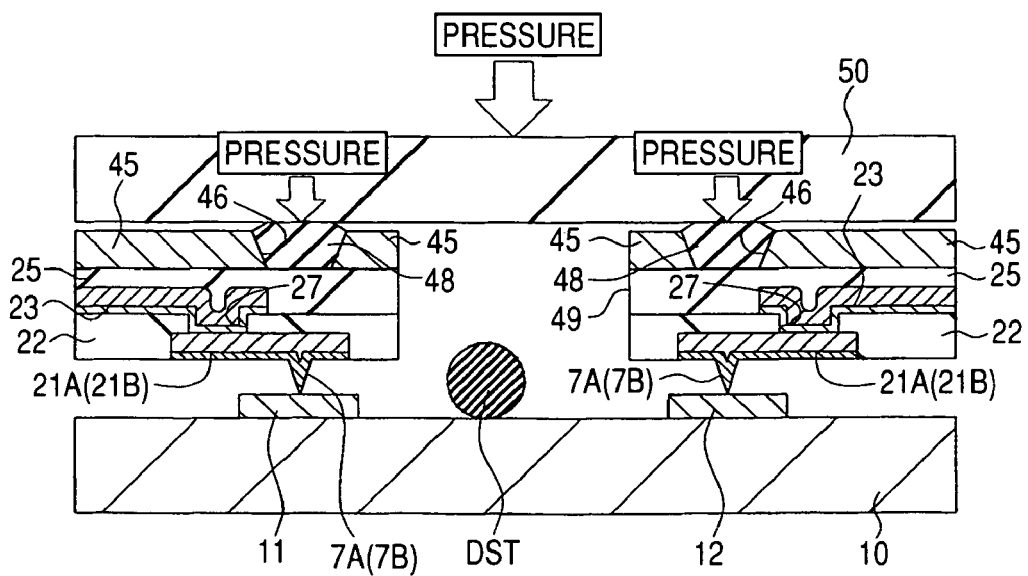
FIG. 28 shows a relevant-part section view for explaining contact between probes and pads of a semiconductor chip, the probes being included by the membrane sheet forming the probe card of an embodiment of the invention.

In the case that a foreign substance DST is adhered to the main surface of the wafer (chip 10) as the test object as shown in FIG. 28, if the opening 49 is not provided in the membrane sheet 2, a trouble may be anxiously caused, the trouble being a trouble that when the probes 7A and 7B are tried to be contacted to the pads 11 and 12, the membrane sheet 2 runs on the foreign substance DST, consequently the probes 7A and 7B can not be contacted to the pads 11 and 12. Moreover, it is anxious that the membrane sheet 2 runs on the foreign substance, thereby the membrane sheet 2 is deformed, and particularly in the case that the foreign substance DST exists near the probes 7A and 7B, a trouble that the probes 7A and 7B stick into the membrane sheet 2 may be anxiously caused. However, since the foreign substance DST can be situated in the opening 49 in a plane, possibility of occurrence of the troubles can be reduced by providing the opening 49.

Here, a planar pattern of the opening 49 is described. FIGS. 29, 31, 33, 35 and 37 show relevant-part plane views of bottoms of the membrane sheets 2, and FIGS. 30, 32, 34, 36 and 38 show relevant-part section views along a line F-F in FIGS. 29, 31, 33, 35 and 37 respectively.

Figure 29:
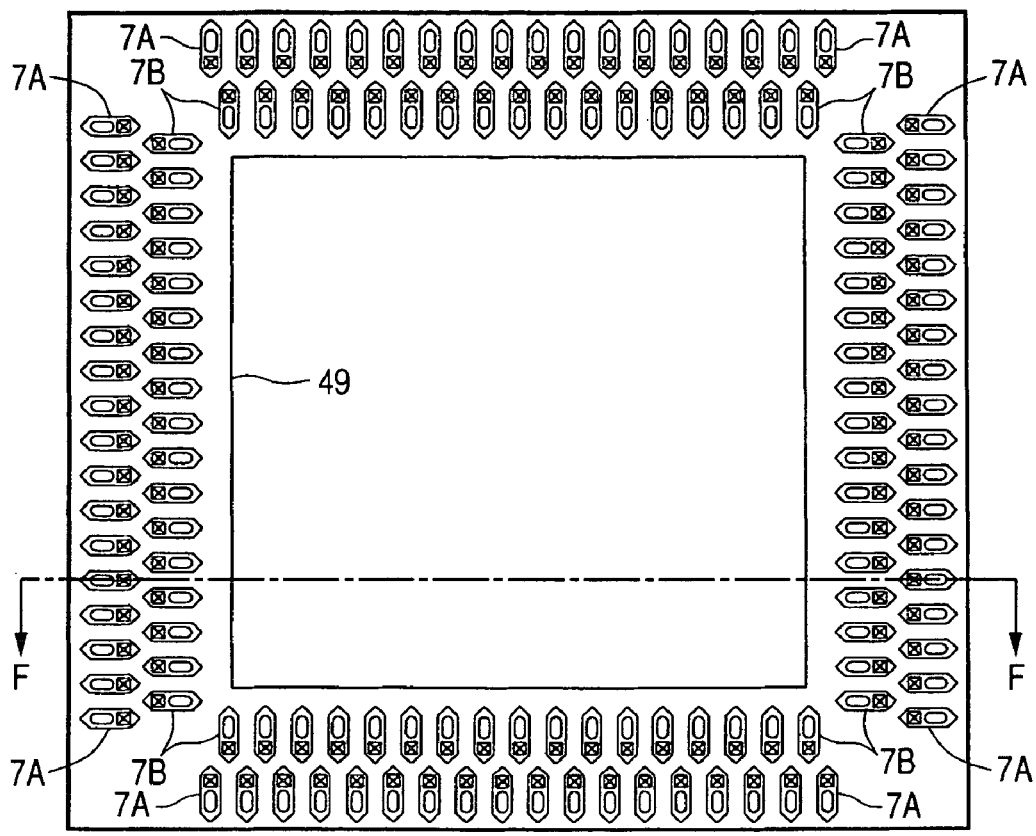
FIG. 29 shows a relevant-part plane view of a membrane sheet forming a probe card of an embodiment of the invention.
Figure 30:
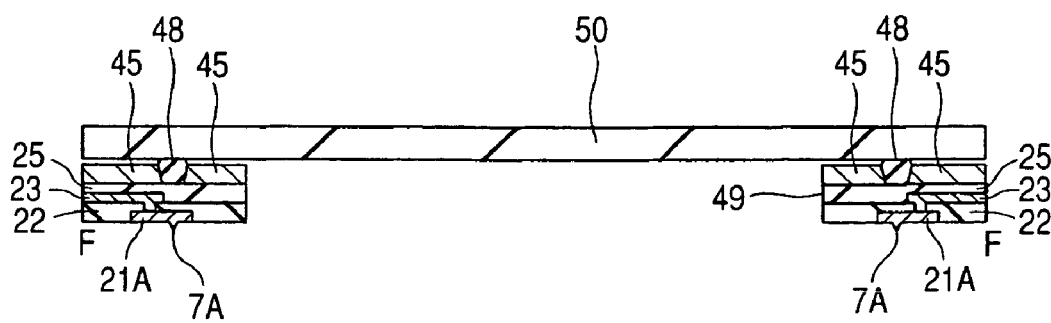
FIG. 30 shows a relevant-part section view along a line F-F in FIG. 29.
Figure 31:
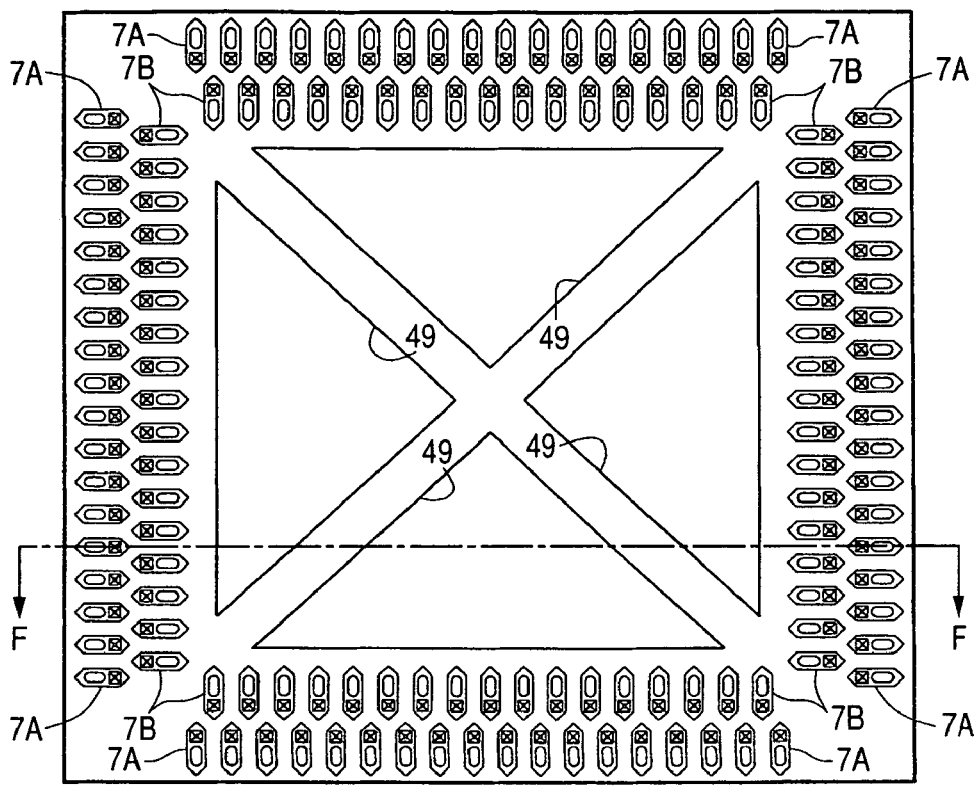
FIG. 31 shows a relevant-part plane view of a membrane sheet forming a probe card of an embodiment of the invention.
Figure 32:
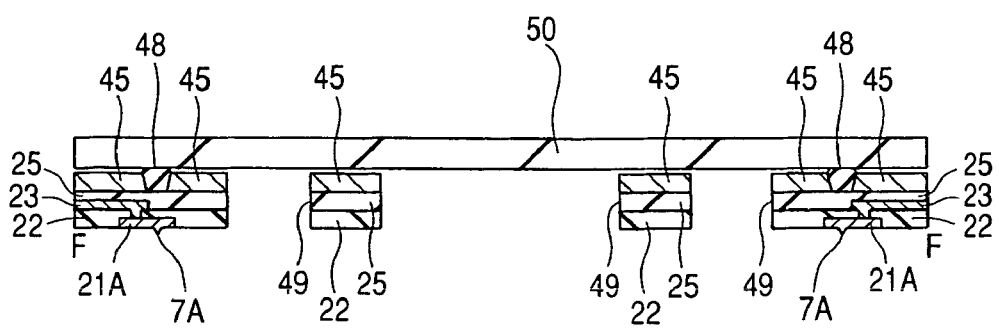
FIG. 32 shows a relevant-part section view along a line F-F in FIG. 31.
Figure 33:
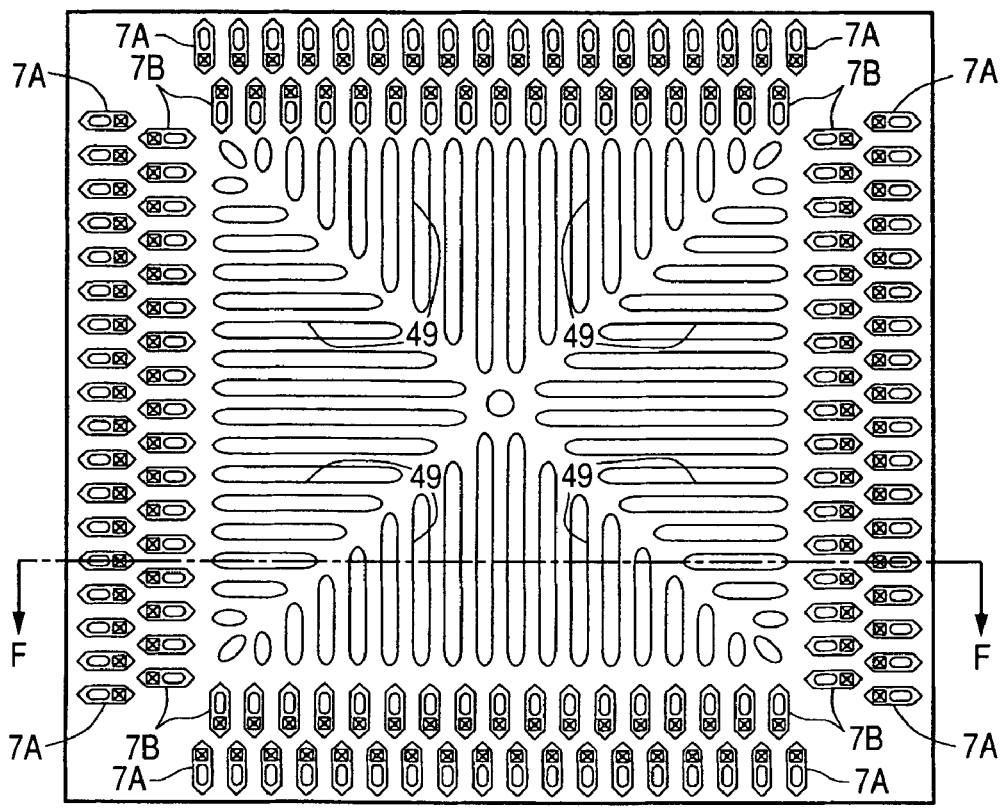
FIG. 33 shows a relevant-part plane view of a membrane sheet forming a probe card of an embodiment of the invention.
Figure 34:
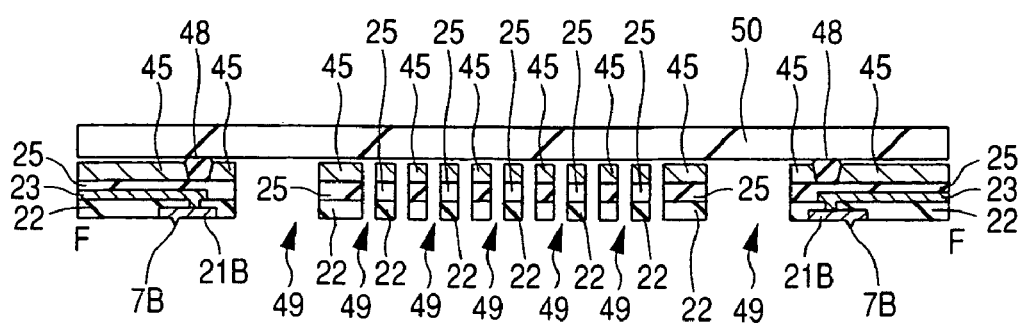
FIG. 34 shows a relevant-part section view along a line F-F in FIG. 33.
Figure 35:
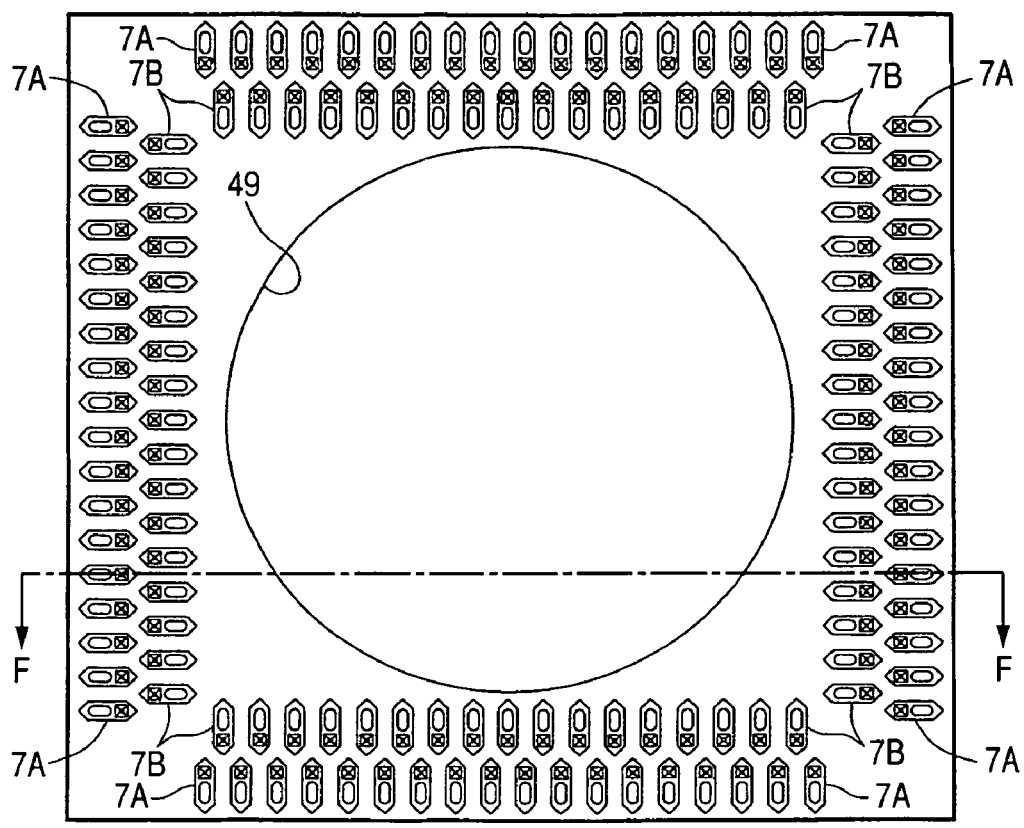
FIG. 35 shows a relevant-part plane view of a membrane sheet forming a probe card of an embodiment of the invention.
Figure 36:
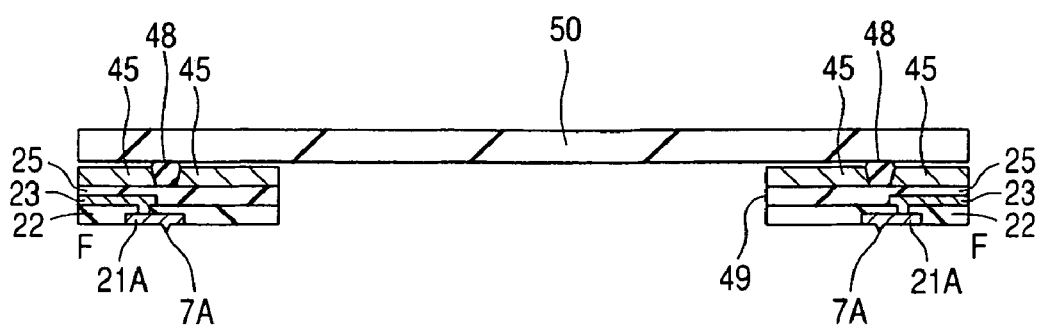
FIG. 36 shows a relevant-part section view along a line F-F in FIG. 35.
Figure 37:
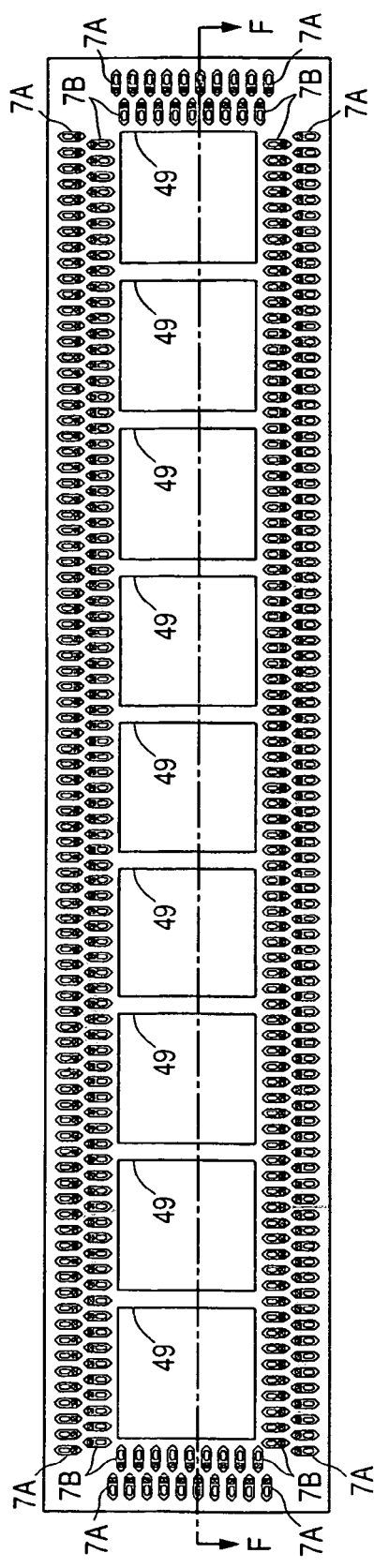
FIG. 37 shows a relevant-part plane view of a membrane sheet forming a probe card of an embodiment of the invention.
Figure 38:
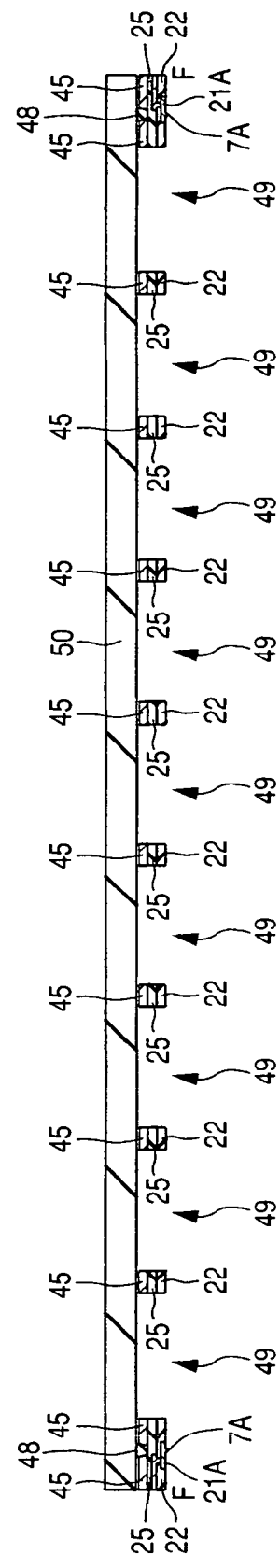
FIG. 38 shows a relevant-part section view along a line F-F in FIG. 37.

In the embodiment 1, as the planar pattern of the opening 49, first a rectangular pattern as shown in FIG. 29 can be exemplified. When stiffness of the membrane sheet 2 is excessively reduced by using such a rectangular pattern, as shown in FIG. 31, a structure may be used, in which the polyimide films 22, 25 and the metal sheet 45 are left in a beam shape on diagonals of the opening 49 in the planar rectangle pattern. Desired stiffness of the membrane sheet 2 can be thus secured. Moreover, a structure may be used as shown in FIG. 33, in which the pattern of the opening 49 as shown in FIG. 31 is processed in a slit pattern, so that the beam-like polyimide films 22, 25 and the metal sheet 45 are left. It also enables desired stiffness of the membrane sheet 2. Such an opening 49 in the slit pattern is formed by drilling using laser as described using FIG. 25, thereby time required for processing can be reduced. When the holding ring 4, adhesion ring 6 and pressing tool 50 described using FIGS. 1 and 2 are in a planar circle shape, the opening 49 may be formed as a planar circle pattern as shown in FIG. 35. In the case that the adhesion ring 6 and pressing tool 50 are in the planar circle shape, when the opening 49 is in a planar rectangle pattern, unusable force is anxiously concentrated into corners of the rectangle patter or the like, however, such concentration of unusable force can be prevented by using the planar circle pattern. Moreover, since the chip 10 as the test object is in a rectangle having short sides and long sides in a plane as described using FIG. 3, a structure may be used as shown in FIG. 37, in which the opening 49 is formed by a planar rectangle pattern having short sides and long sides, and the polyimide films 22, 25 and the metal sheet 45 are left in a pattern of several beams extending in a direction along the short sides in the planar rectangle pattern. Thereby, desired stiffness can be secured in the membrane sheet 2.

Next, a probe test step using the probe card (see FIGS. 1 and 2) having the membrane sheet 2 in the embodiment 1 is described.

Figure 39:
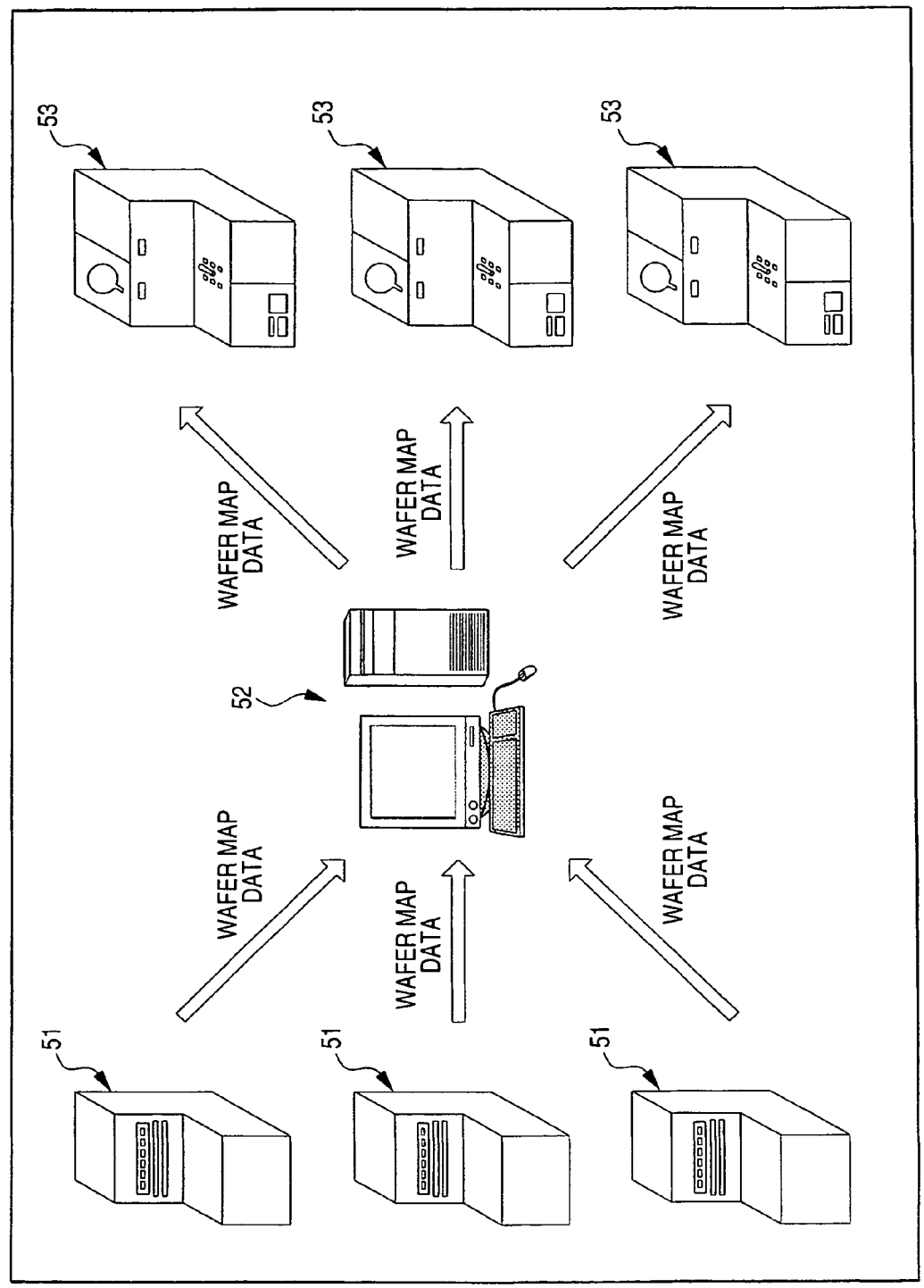
FIG. 39 shows an explanatory view showing a configuration of respective devices used in a probe test step of an embodiment of the invention.

FIG. 39 shows an explanatory view showing a configuration of each device for use in the probe test step in the embodiment 1. First, a wafer WH is prepared (see FIG. 45), in which a process has been completed to a step of forming the pads 11 (see FIG. 3). Next, appearance of a main surface of the wafer WH as a test object is tested using an appearance tester 51. A purpose of the appearance test is to inspect presence of the foreign substance DST (see FIG. 28) on the main surface of the chip 10 and a shape of the pads 11, and find these abnormalities in the early stage, so that keep a fabrication yield of a semiconductor integrated circuit device. For example, in the case that the foreign substance DST adhered on the main surface of the wafer WH is a conductive substance, or in the case that abnormality is found in the (planar) shape of the pads 11, adjacent pads 11 may be directly short-circuited to each other, or may be short-circuited via the foreign substance DST. Therefore, the abnormalities are found in the early stage, and a cause of the abnormalities is clarified, thereby occurrence of the abnormalities from the same cause can be prevented. That is, fabrication of a large number of bad products can be prevented. Moreover, another purpose of the appearance test is to prevent adhesion of the foreign substance DST, or shipment of a product having abnormality in shape of the pads 11.

Figure 40:
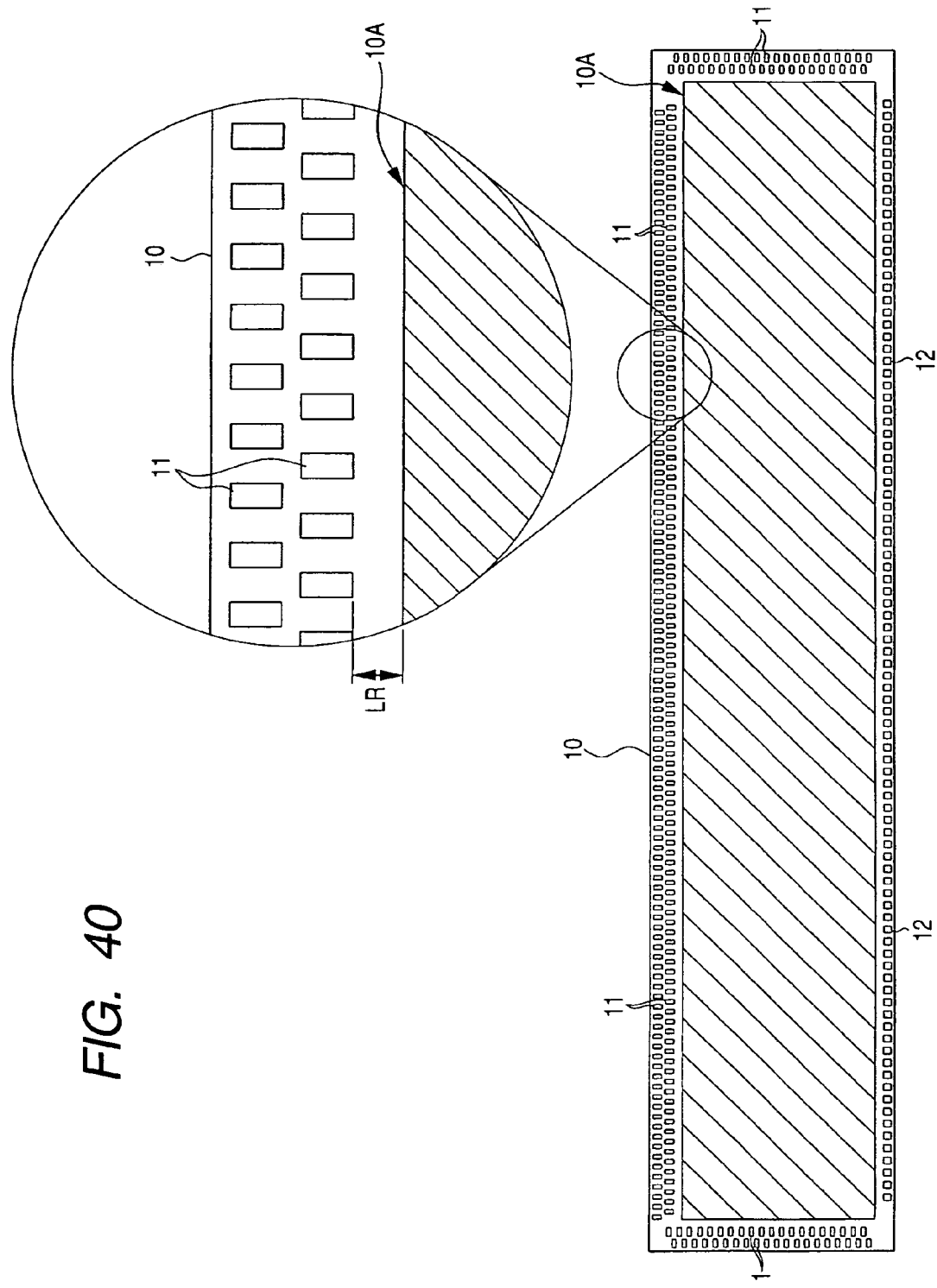
FIG. 40 shows a plane view for explaining definition of regions in a main surface of a semiconductor chip as an object of a probe test using a probe card of an embodiment of the invention.
Figure 41:
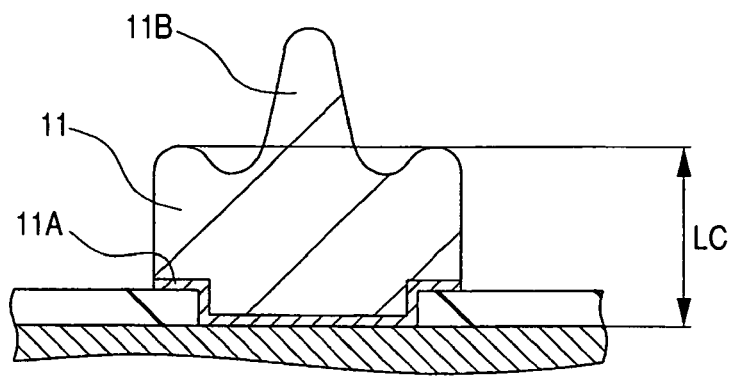
FIG. 41 shows a relevant-part section view for explaining abnormality in shape of a pad provided on the main surface of the semiconductor chip as the object of the probe test using the probe card of the embodiment of the invention.
Figure 42:
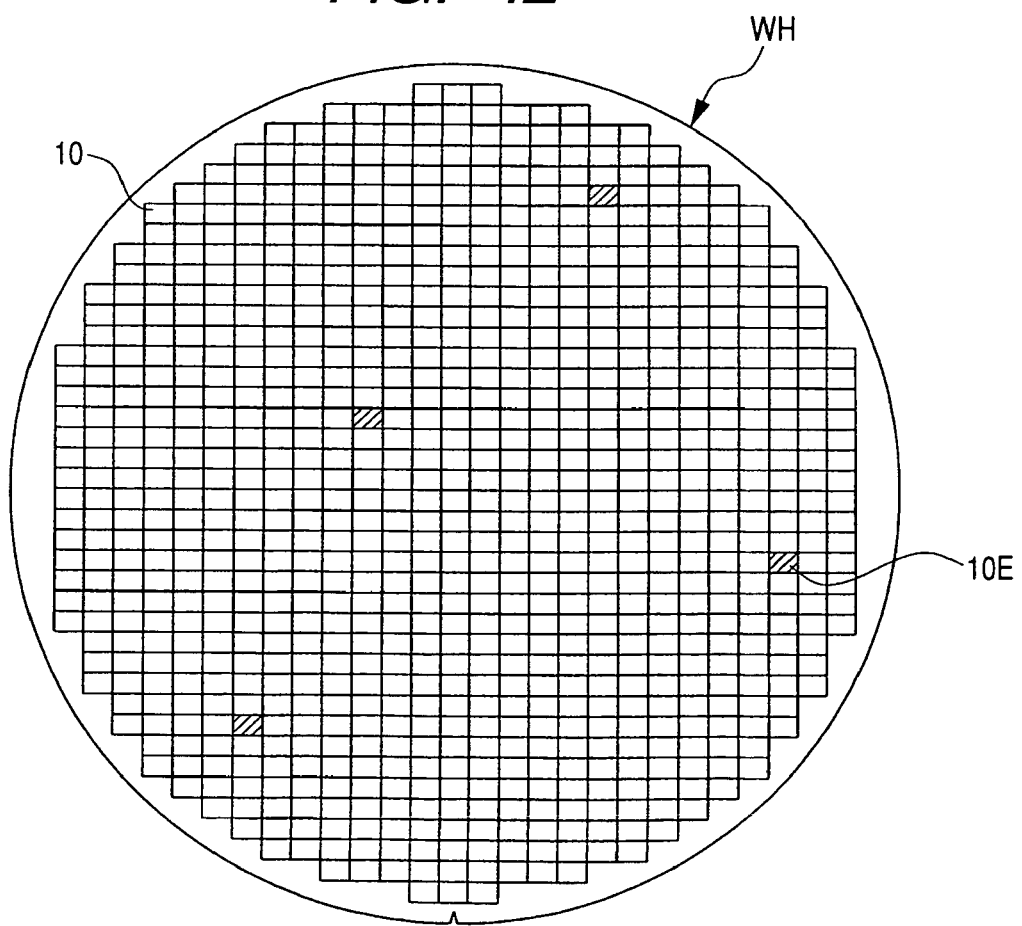
FIG. 42 shows an explanatory view showing wafer map data as collection of results of an appearance test of a semiconductor chip as an object of the probe test using the probe card of the embodiment of the invention.

In the appearance test of the main surface of the wafer WH using the appearance tester 51, as shown in FIG. 40, the main surface of the chip 10 is divided into a region 10A and other one region, the region 10A being an inner side from positions a distance (first distance), which is longer than the length LB (see FIG. 3 (for example, about 19 μm) of the short side of the pads 11, apart from pads 11 arranged in a relatively inner side in the main surface of the chip 10. Then, the region 10A is divided into regions (second regions) in a rectangle, for example, about 30 μm in one side, and appearance is tested for each of regions (second regions). The region other than the region 10A, which has the pads 11 disposed therein, and is disposed in a way of enclosing the region 10A, is divided into regions (first regions) in a rectangle, for example, about 10 μm in one side, and appearance is tested for each of regions (first regions). The reason why the region other than the region 10A in which the pads 11 are disposed is divided more minutely than the region 10A in this way is because in the case that the foreign substance DST adhered to the main surface of the wafer WH is a conductive substance, or in the case that abnormality is found in the (planar) shape of the pads 11, adjacent pads 11 may be electrically short-circuited to each other as described before, therefore more accurate test is required. Moreover, in the embodiment 1, as shown in FIG. 41, the height LC (see also FIG. 4) of the pad 11 is defined as height from a lowest portion of a base film for bump electrode 11A being contacted to a wiring line as a lower layer to a top of the pad 11 except for a protruded portion 11B, and a case that the protruded portion 11B is formed is assumed as abnormality in height of the pad 11 under such definition. That is, the appearance test specifies a chip 10, in which a foreign substance DST protruded from the first or second region, or abnormality in shape (planar shape and height) of the pad 11 was detected, as a bad chip. Results of such an appearance test are collected as wafer map data (first data) according to lines of respective chips 10 in a plane of the wafer WH as shown in FIG. 42, and in the wafer map data, positions (first position) where chips (region of first group chips) 10E (shown with hatching in FIG. 42) are disposed in which abnormality in appearance was detected, and positions where other chips 10 (region of second group chips) are disposed are recorded.

When the appearance test is finished for all the chips 10 in the wafer WH, the wafer map data are further added with information for identifying the wafer WH and then transmitted to a server 52, and stored therein. Then, the wafer WH is carried into a probe tester 53, and wafer map data corresponding to the wafer WH carried into the probe tester 53 are transmitted from the server 52 to the probe tester 53. Here, the number of appearance tester 51 and probe tester 53 are not limited to one respectively. That is, when appearance testers 51 and probe testers 53 are severally disposed respectively, and they are not in one-to-one correspondence respectively (when the wafer WH is not determined to be carried from a predetermined appearance tester 51 to a predetermined probe tester 53), the server 52 disposed between the appearance tester 51 and the probe tester 53, thereby transmission and reception of the wafer map data can be realized between the appearance tester 51 and the probe tester 53. When one appearance tester 51 and one probe tester 53 are provided respectively, and a wafer WH subjected to the appearance test in the appearance tester 51 is carried into the probe tester 53 without being temporally held in a different place, and subjected to the probe test, the server 52 may be omitted such that wafer map data for the wafer WH are directly transmitted from the appearance tester 51 to the probe tester 53.

In the probe tester 53, the probe test using the probe card having the membrane sheet 2 (see FIGS. 1 and 2) is performed. The probe tester 53 performs the probe test to the wafer WH based on the wafer map data transmitted from the server 52. That is, the probe test is omitted to chips 10 as the chips 10E (see FIG. 42) in which abnormality in appearance was detected in the wafer map data. As a result, a step of contacting the probes 7A, 7B (see FIGS. 6 to 8) to the pads 11 can be omitted for the chips 10 as the chips 10E (see FIG. 42) in which abnormality in appearance was detected.

When the probes 7A, 7B are contacted to the pads 11, if a foreign substance DST is adhered to the main surface of the wafer WH (chip 10), which can not be prevented from being contacted to the membrane sheet 2 even by providing the opening 49 (see FIG. 28) in the membrane sheet 2 (see FIG. 2), or the protruded portion 11B is formed in the pad 11, the membrane sheet 2 is anxiously deformed by running on the foreign substance DST or the protruded portion 11B, and particularly when the foreign substance DST or the protruded portion 11B exists near the probes 7A, 7B, a trouble that the probes 7A, 7B stick into the membrane 2 may anxiously occur. Even if the membrane 2 is not broken unlike this, the membrane sheet 2 may be anxiously damaged due to contact to the foreign substance DST or the protruded portion 11B. In the case that the distance (needle height H101) between the end of the probe 201 and the portion (needle holder part 203) substantially supporting the end is about several hundreds micrometers or more like the usual probe card in the cantilever type including the probe 201, probe substrate 202 and needle holder part 203 as shown in FIG. 53, since the needle height H101 is larger than needle height in the membrane sheet 2 of the embodiment 1 (height LZ from the surface of the polyimide film 22 to the ends of the probes 7A, 7B (see FIG. 11)), the needle holder part 203 may be broken by running on the foreign substance DST or the protruded portion 11B at low possibility. Thus, as in the embodiment 1, the step of contacting the probes 7A, 7B to the pads 11 is omitted for the chips 10 as the chips 10E (see FIG. 42) in which abnormality in appearance was detected in the wafer map data, thereby such breakage or damage of the membrane sheet 2 can be prevented. According to an experiment conducted by the inventors, while in the case that the probe test was carried out even for chips 10 determined as bad chips in the appearance test using the appearance tester 51, the membrane sheet 2 ended its life at an average number of contact times of 200,000 between the probes 7A, 7B and the pads 11, in the case of the embodiment 1 where the probe test was omitted for the chips 10 determined as bad chips, the membrane sheet 2 ended its life at an average number of contact times of 500,000 between the probes 7A, 7B and the pads 11. That is, according to the embodiment 1, the life of the membrane sheet 2 can be extremely extended.

Embodiment 2

Next, embodiment 2 is described.

Figure 43:
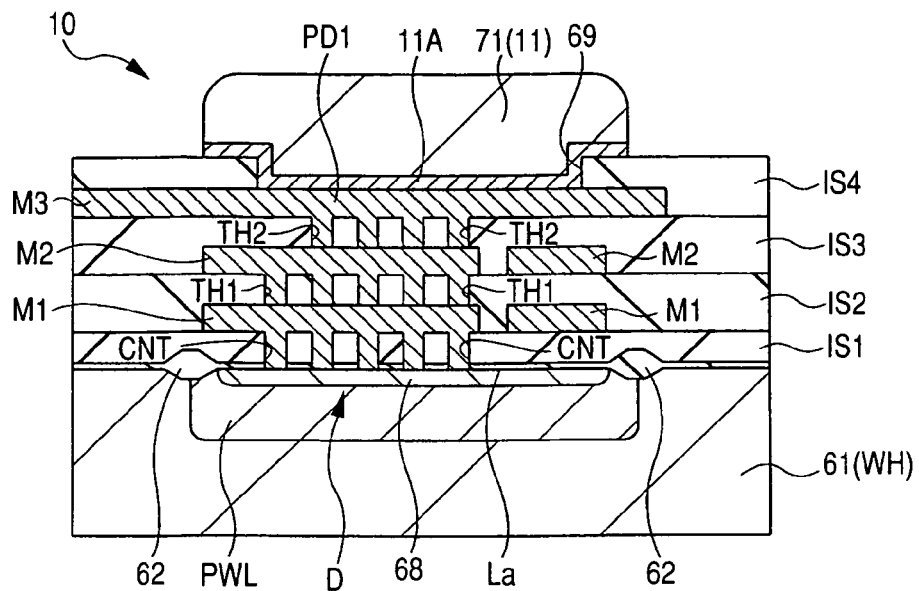
FIG. 43 shows a relevant-part section view of a semiconductor chip as an object of a probe test using a probe card of a different embodiment of the invention.
Figure 44:
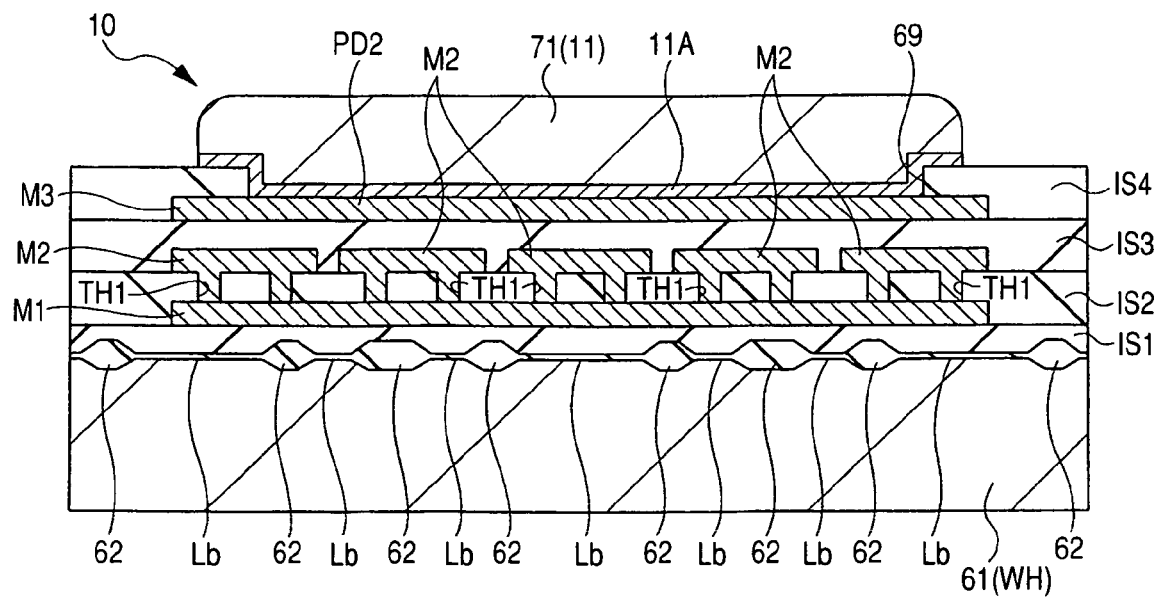
FIG. 44 shows a relevant-part section view of a semiconductor chip as an object of a probe test using a probe card of the different embodiment of the invention.

FIGS. 43 and 44 show relevant-part section views of a chip 10 having an LCD driver formed therein, which was described also in the embodiment 1, and show cross sections different from each other.

A substrate 61 (wafer WH) includes a p-type single-crystal Si, and in a device formation surface as a main surface of the substrate, an isolation part 62 is formed to define active regions La and dummy active regions Lb. The isolation part 62 includes a silicon oxide film formed by, for example, a LOCOS (Local Oxidation of Silicon) process. However, the isolation part 62 may be formed by an isolation part 62 in a groove type (SGI: Shallow Groove Isolation or STI: Shallow Trench Isolation).

For example, a pn-junction diode D is formed in an active region La enclosed by the isolation part 62 in the substrate 61 as a layer under a pad PD1 as shown in FIG. 43. The pn-junction diode D is, for example, a protective diode for preventing electrostatic breakdown, and formed by pn junction between a p-type well PWL in the substrate 61 and an n-type semiconductor region 68 as an upper part thereof. An insulating film IS1 including a silicon oxide film is formed over a main surface of the substrate 61. A first-layer wiring line M1 is formed thereon. The first-layer wiring line M1 has a configuration where, for example, titanium, titanium nitride, aluminum (or aluminum alloy), and titanium nitride are deposited in order from a lower layer. A film of the aluminum or aluminum alloy is material of a main wiring line, and formed to have the largest thickness. The first-layer wiring line M1 is coupled to the n-type semiconductor region 68, that is, the pn-junction diode D through a plurality of contact holes CNT in a planar circle shape formed in the insulating film IS1. The first-layer wiring line M1 is covered with an insulating film IS2 including a silicon oxide film. A second-layer wiring line M2 is formed over the insulating film IS2. A material configuration of the second-layer wiring line M2 is the same as that of the first-layer wiring line M1. The second-layer wiring line M2 is electrically coupled to the first-layer wiring line M1 through a plurality of throughholes TH1 in a planar circle shape formed in the insulating film IS2. The second-layer wiring line M2 is covered with an insulating film IS3 including a silicon oxide film. A third-layer wiring line M3 is formed over the insulating film IS3. The third-layer wiring line M3 is electrically coupled to the second-layer wiring line M2 through a plurality of throughholes TH2 in a planar circle shape formed in the insulating film IS3. Furthermore, while the major part of the third-layer wiring line M3 is covered with an insulting film IS4 for surface protection, a part of the third-layer wiring line M3 is exposed from an opening 69 in a planar rectangle shape formed in a part of the insulating film IS4. The portion of the third-layer wiring line M3 exposed from the opening 69 is the pad PD1. The insulting film IS4 for surface protection includes a single substance film such as silicon oxide film, a stacked film having a structure that a silicon nitride film is stacked over a silicon oxide film, or a stacked film having a structure that a silicon nitride film and a polyimide film are stacked in order from a lower layer over a silicon oxide film. The pad PD1 is bonded to a bump electrode (projection electrode) 71 (pad 11 (see FIGS. 3 and 4)) via the base film for bump electrode 11A through the opening 69. The base film for bump electrode 11A has a function of improving adhesion between the bump electrode 71 and the pad PD or the insulating film IS4, in addition, a barrier function of suppressing or preventing movement of a metal element of the bump electrode 71 to a side of the third-layer wiring line M3, and conversely movement of a metal element of the third-layer wiring line M3 to a side of the bump electrode 71, and includes a single substance film as a film of high-melting-point metal such as titanium or titanium-tungsten, or a stacked film having a structure that a nickel film and gold are stacked in order from a lower layer on a titanium film. As described in the embodiment 1, the bump electrode 71 includes an Au film, and is formed by a plating process.

On the other hand, while the dummy active region Lb is formed in the substrate 61 as a layer under a dummy pad PD2 shown in FIG. 44 as described before, an element is not particularly formed in the dummy active region Lb. It is obvious that a diode or other elements may be formed as another pad PD1, or a p-type well or an n-type well may be provided. The second-layer wiring line M2 and the first-layer wiring line M1 under the dummy pad PD2 are electrically coupled to each other through a plurality of throughholes TH1. Since the pad PD2 is dummy, the second-layer wiring line M2 and the first-layer wiring line M1 under the pad need not be electrically coupled to each other, however, the throughholes TH1 are disposed in a layer under the pad PD2 so that height of the top of a bump electrode 41 to be bonded to the dummy pad PD2 is made further close to height of the top of a bump electrode 41 to be bonded to another pad PD.

Next, an example of a fabrication process of the chip 10 is described. First, the isolation part 62 is formed, for example, by the LOCOS process over the main surface of the wafer-like substrate 61 (wafer WH), so that the active region La and the dummy active region Lb are formed, then an element (for example, high-withstanding-voltage MISFET (Metal Insulator Semiconductor Field Effect Transistor) and low-withstanding-voltage MISFET) is formed in the active region La enclosed by the isolation part 62. The element is not formed in the dummy active region Lb under the dummy pad PD2. Then, the insulating film IS1 is deposited over the main surface of the substrate 61 by a CVD (Chemical Vapor Deposition) process or the like, and then the contact holes CNT in the planar circle shape are formed at predetermined points in the insulating film IS1 by the photolithography technique and the dry etching technique. Then, for example, titanium nitride, a titanium film, an aluminum film, and a titanium nitride film are deposited in order from a lower layer by a sputtering process or the like over the insulating film IS1, and then the stacked metal films are patterned by the photolithography technique and the dry etching technique, so that the first-layer wiring line M1 is formed. Then, the insulating film IS2 is similarly deposited over the insulating film IS1, and then the throughholes TH1 are formed in the insulating film IS2, and then the second-layer wiring line M2 is formed over the insulating film IS2 as the first-layer wiring line M1. Then, the insulating film IS3 is similarly deposited over the insulating film IS2, and then the throughholes TH2 are formed in the insulating film IS3, and then the third-layer wiring line M3 is formed over the insulating film IS3 as the first-layer wiring line M1. Then, the insulating film IS4 for surface protection is deposited over the insulating film IS3, and then the opening 69 exposing part of the third-layer wiring line M3 is formed over the insulating film IS4, so that the pads PD1 and PD2 are formed. Then, over the insulating film IS4, a conductive film is deposited by the sputtering process or the like, the conductive film including a single substance film as a film of high-melting-point metal such as titanium or titanium-tungsten, or a stacked film having the structure that a nickel film and a gold film are stacked in order from a lower layer over a titanium film, and then a photoresist pattern is formed thereon such that a bump formation region is exposed, and other regions are covered.

Next, the bump electrode 71 (pad 11) including gold is formed. As described before, the bump electrode 71 (pad 11) can be formed by forming the Au film by the plating process using a photoresist pattern, in which an opening is provided by a photolithography technique, as a mask.

Next, the photoresist film is removed, and furthermore a conductive film as a base is removed by etching, thereby the base film for bump electrode 11A is formed. Then, the substrate 61 (wafer WH) is cut into individual chips 10.

Figure 45:
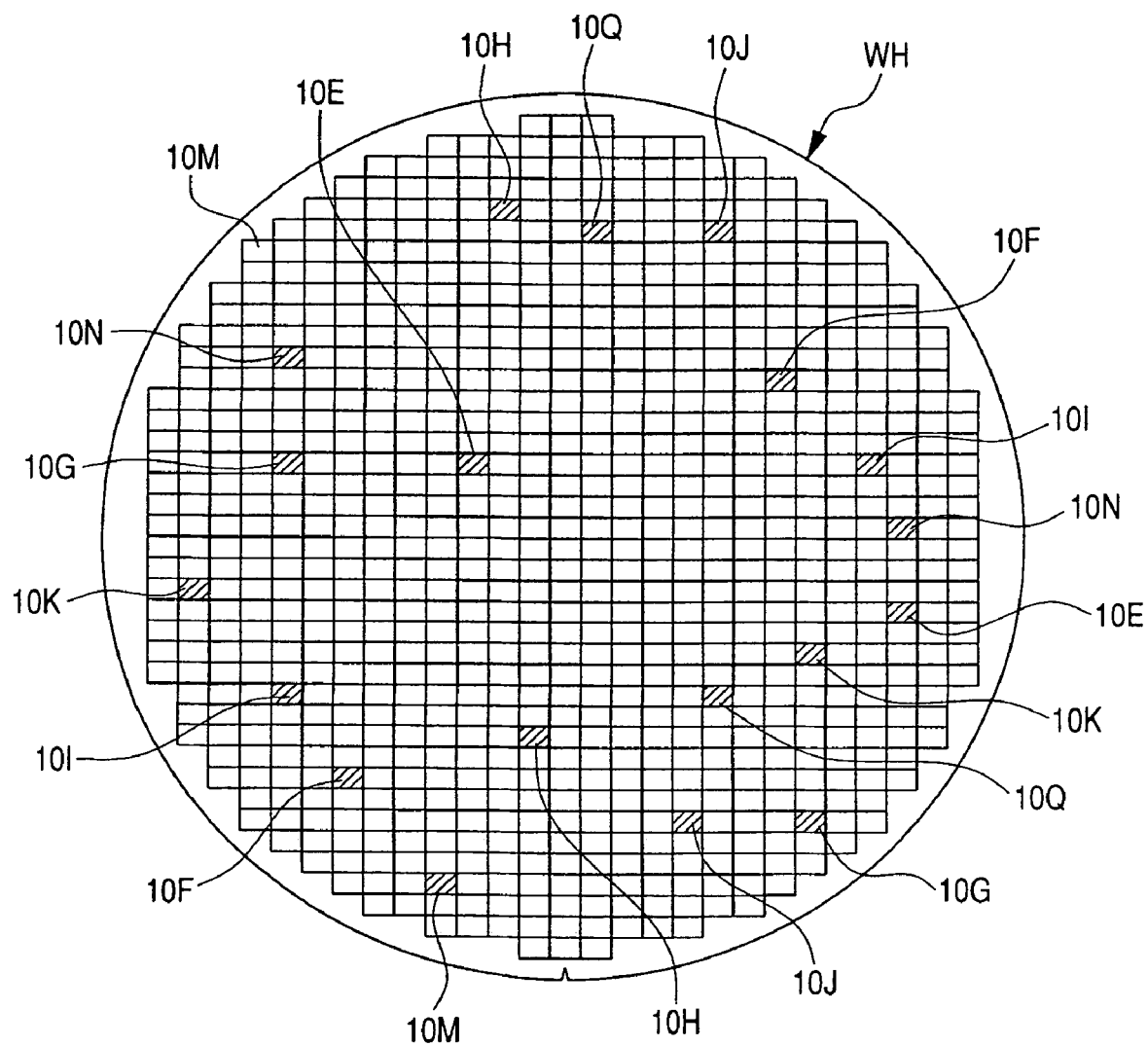
FIG. 45 shows an explanatory view showing wafer map data as collection of results of an appearance test of a semiconductor chip as an object of a probe test using a probe card of the different embodiment of the invention.

While an example that the appearance test was performed to the wafer WH, in which the wafer process had been completed to a step of forming the pads 11 (see FIG. 3), using the appearance tester 51 (see FIG. 39), and results were collected as the wafer map data was described in the embodiment 1, the embodiment 2 exemplifies a case that the appearance test is performed using the appearance tester 51 also after other steps, and test results on adhesion of the foreign substance to the main surface of the wafer WH and abnormality in shape of the wiring line are collected as wafer map data. For example, the appearance test is performed also after forming the active region La and the dummy active region Lb, after forming a gate electrode (omitted to be shown) of the high-withstanding-voltage MISFET, after forming a gate electrode (omitted to be shown) of the low-withstanding-voltage MISFET, after forming the contact holes CNT, after forming the first-layer wiring line M1, after forming the second-layer wiring line M2, after forming the third-layer wiring line M3, and after forming the opening 69 in the insulating film IS4 respectively, and the wafer map data obtained in respective appearance tests are overlapped to create final wafer map data. It can be exemplified that the appearance test is performed after each step to about 1% of all the wafers WH in which the chips 10 of the embodiment 2 are formed. Here, FIG. 45 shows an explanatory view showing the final wafer map data showing a chip 10F in which abnormality in appearance was detected in an appearance test after forming the active region La and the dummy active region Lb, a chip 10G in which abnormality in appearance was detected in an appearance test after forming the gate electrode (omitted to be shown) of the high-withstanding-voltage MISFET, chip 10H in which abnormality in appearance was detected in an appearance test after forming the active region La and the dummy active region Lb, a chip 10I in which abnormality in appearance was detected in an appearance test after forming the gate electrode of the high-withstanding-voltage MISFET, a chip 10J in which abnormality in appearance was detected in an appearance test after forming the gate electrode of the low-withstanding-voltage MISFET, a chip 10K in which abnormality in appearance was detected in an appearance test after forming the contact holes CNT, a chip 10L in which abnormality in appearance was detected in an appearance test after forming the first-layer wiring line M1, a chip 10M in which abnormality in appearance was detected in an appearance test after forming the second-layer wiring line M2, a chip 10N in which abnormality in appearance was detected in an appearance test after forming the third-layer wiring line M3, a chip 10Q in which abnormality in appearance was detected in an appearance test after forming the opening 69 in the insulating film IS4, a chip 10E in which abnormality in appearance was detected in an appearance test after forming the pads 11 (bump electrodes 71), and chips 10 other than those, wherein the chips 10E to 10Q are shown with being marked with hatching. Based on the final wafer map data formed in this way, the probe tester 53 (see FIG. 38) performs the probe test using the probe card having the membrane sheet 2 (see FIGS. 1 and 2). Thereby, shipment of a chip 10 in which abnormality in appearance was detected in each step can be prevented.

Moreover, the wafer map data obtained in respective appearance tests are overlapped to create the final wafer map data, and the probe test is performed overly to the chips 10 in which abnormality in appearance is not detected in the final wafer map data, thereby time required for the probe test can be reduced.

According to the embodiment 2 as above, the same advantages as advantages of the embodiment 1 can be obtained.

Embodiment 3

Figure 47:
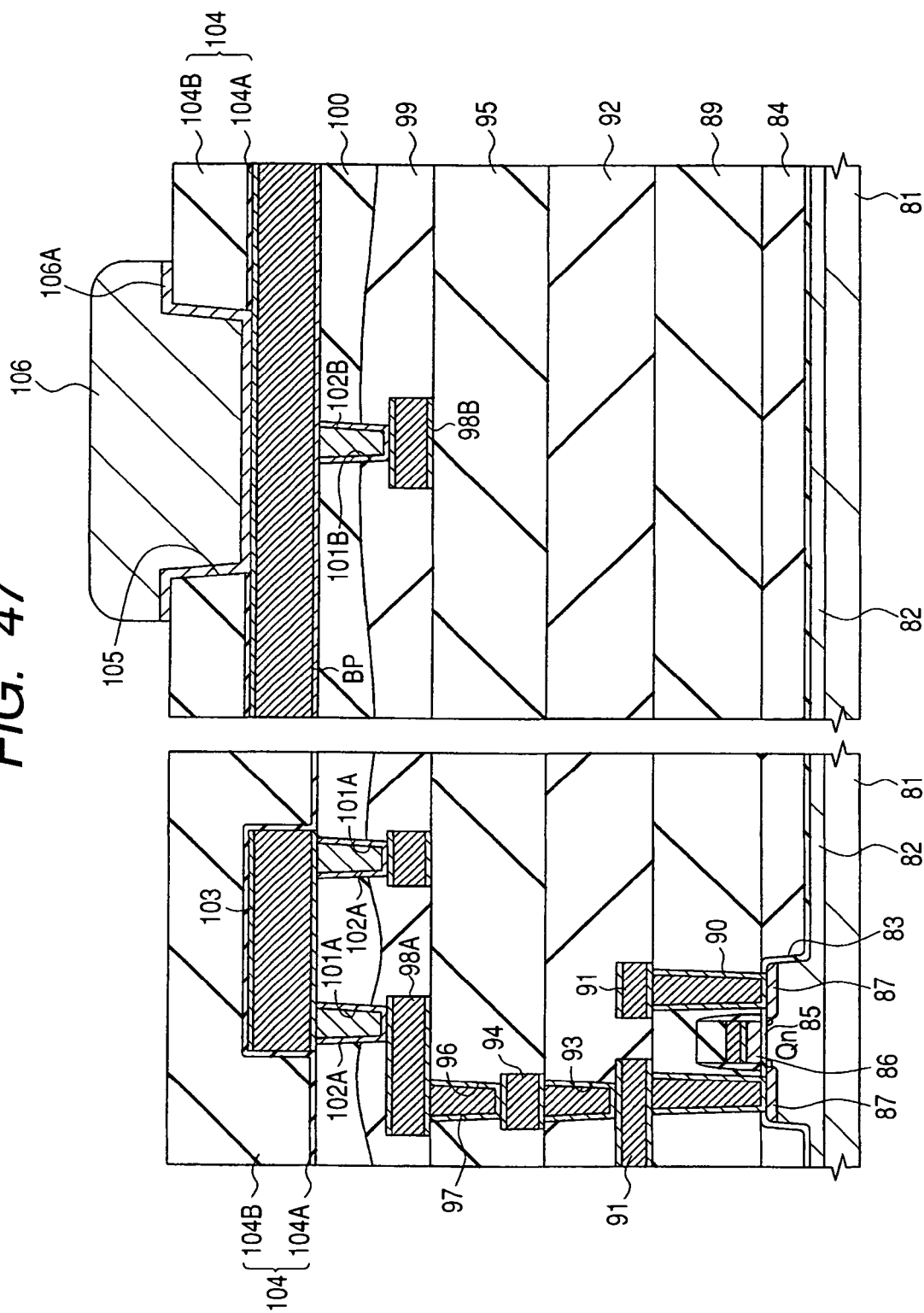
FIG. 47 shows a relevant-part section view during a fabrication process of a semiconductor integrated circuit device of a still different embodiment of the invention.

FIG. 47 shows a cross section view showing a relevant part of a semiconductor chip in which a semiconductor integrated circuit device of embodiment 3 is formed, wherein a section at the left on paper shows a region where a stacked wiring is formed, and a section at the right on paper shows a region where a bonding pad (hereinafter, simply refer to pad) is formed.

A p-type well 82 is formed over a main surface of a substrate 81 including p-type single crystal Si (silicon), and an element isolation groove 83 is formed in an element isolation region of the p-type well. The element isolation groove 83 is in a configuration where a groove formed by etching the substrate 81 is filled with an insulating film 84 such as a silicon oxide film.

N-channel type MISFET Qn mainly includes a gate oxide film 85, gate electrode 6, and n-type semiconductor regions (source, drain) 87 in an LDD (Lightly Doped Drain) structure. The gate electrode 6 is formed by a 3-layer conductive film formed by stacking a low-resistance polycrystalline silicon film doped with P (phosphorous) or the like, WN (tungsten nitride) film, and W (tungsten) film.

A silicon oxide film 89 is formed over the n-channel type MISFET. Contact holes penetrating to the n-type semiconductor regions (source, drain) 87 of the n-channel type MISFET Qn are formed in the silicon oxide film 89, and plugs 90 including a stacked film of barrier metal (TiN/Ti) and a W film are filled within the contact holes.

A first-layer wiring line 91 is formed over the silicon oxide film 89. The wiring line 91 is formed by a 3-layer conductive film including an aluminum alloy film (for example, containing Cu (copper) and Si) having large thickness, which contains Al as a major component, and a Ti film and a TiN film, each of them having small thickness, sandwiching the Al alloy film. The wiring line 91 is electrically coupled to one of the n-type semiconductor regions (source, drain) 87 of the n-channel type MISFET Qn through the plugs 90.

A silicon oxide film 92 is formed over the wiring line 91. A contact hole penetrating to the wiring 91 is formed in the silicon oxide film 92, and a plug 93 including a stacked film of barrier metal (TiN/Ti) and a W film is filled within the contact hole as the plugs 90.

A second-layer wiring line 94 having the same configuration as that of the wiring line 91 is formed over the silicon oxide film 92. The wiring line 94 is electrically coupled to the wiring line 91 through the plug 93.

A silicon oxide film 95 is formed over the wiring line 94. A contact hole 96 penetrating to the wiring line 94 is formed in the silicon oxide film 95, and a plug 97 including a stacked film of barrier metal (TiN/Ti) and a W film is filled within the contact hole as the plugs 90 and 93.

Third-layer wiring lines 98A and 98B having the same configuration as that of the wiring lines 91 and 94 are formed over the silicon oxide film 95. The wiring line 98A disposed in a region where the stacked wiring is formed is electrically coupled to the wiring line 94 through the plug 97. The wiring line 98B is disposed in a region where the pad is formed.

Silicon oxide films 99, 100 formed in plasma are stacked over the wiring line 98. In the region where the stacked wiring is formed, contact holes 101A penetrating to the wiring line 98A are formed in the silicon oxide films 99 and 100, and plugs 102A including a stacked film of barrier metal (TiN/Ti) having small thickness and a W film having large thickness are filled within the contact holes as the plugs 90, 93 and 97. On the other hand, in the region where the pad is formed, a contact hole 101B penetrating to the wiring line 98B is formed in the silicon oxide films 99 and 100, and a plug 102B including a stacked film of barrier metal (TiN/Ti) and a W film is filled within the contact hole.

In the region where the stacked wiring is formed, a fourth-layer wiring line 103 is formed over the silicon oxide film 100. A pad BP is formed over the plug 102B.

The wiring line 103 is formed by a 3-layer conductive film including an aluminum alloy film having large thickness, and a Ti film and a TiN film, each having small thickness, sandwiching the Al alloy film. The wiring line 103 is electrically coupled to the wiring line 98A through the plugs 102A. The pad BP is formed using a wiring line formed in the same process as in the wiring line 103 configured by the 3-layer conductive film.

A surface protection film 104 configured by 2-layer insulating film formed by, for example, stacking a silicon oxide film 104A and a silicon nitride film 104B on the fourth-layer wiring line 23 and the pad BP. In the upper part of the pad BP, an opening 105 penetrating to the pad BP is formed in the surface protection film 104.

The pad BP is bonded to a bump electrode (projection electrode) 106 via a base film for bump electrode 106A through the opening 105.

Next, a fabrication method of the semiconductor integrated circuit device of the embodiment 3 configured as above is described.

First, a substrate 81 including single-crystal silicon having a resistivity of about 10 Ωcm is subjected to heat treatment, so that a thin silicon oxide film (pad oxide film) is formed over a main surface thereof. Then, a silicon nitride film is deposited over the silicon oxide film by the CVD (Chemical Vapor Deposition) process, and then the silicon nitride film and the silicon oxide film in an element isolation region are removed by dry etching using a photoresist film as a mask. The silicon oxide film is formed for the purpose of reducing stress applied to the substrate when a silicon oxide film filled within an element isolation groove is densified (vitrified) in a later step. Since the silicon nitride film has a hardly oxidizable property, it is used as a mask for preventing oxidation of a surface of the substrate in a region (active region) under the film.

Next, for example, a groove having a depth of about 350 nm is formed in the substrate 81 in the element isolation region by dry etching using the silicon nitride film as a mask, then the substrate 81 is subjected to heat treatment to form a thin silicon oxide film on an inner wall of the groove in order to remove a damaged layer produced in the inner wall of the groove by etching.

Next, the silicon oxide film 84 is deposited over the substrate 81, and then the substrate 81 is subjected to heat treatment to densify (vitrify) the silicon oxide film 84 in order to improve quality of the silicon oxide film 84. Then, the silicon oxide film 84 is polished by a chemical mechanical polishing (CMP) process using the silicon nitride film as a stopper and left within the groove, thereby the element isolation region 83 having a planarized surface is formed.

Next, the silicon nitride film left on the active region of the substrate 81 is removed by wet etching using hot phosphoric acid, and then the substrate 81 is subjected to ion implantation of B (boron) to form a p-type well 82.

Next, the substrate 81 is subjected to heat treatment, thereby the gate oxide film 85 is formed over a surface of the p-type well 82, and then the gate electrode 86 is formed over the gate oxide film 85. The gate electrode 86 is formed by, for example, stacking a low-resistance polycrystalline silicon film doped with P, WN (tungsten nitride) film, and W (tungsten) film in this order, and then patterning the thin films by dry etching using a photoresist film as a mask.

Next, the p-type well 82 is subjected to ion implantation of P or As (arsenic) to form an $n^-$-type semiconductor region. Then, for example, a silicon oxide film is deposited over the substrate 1, and then the silicon oxide film is anisotropically etched, thereby a sidewall spacer is formed over a sidewall of the gate electrode 86. Then, a region, where the n-channel-type MISFET Qn is to be formed, in the substrate 81 is subjected to ion implantation of P or As (arsenic), thereby an $n^+$-type semiconductor region is formed in a self-aligning manner for the sidewall spacer, and consequently the n-type semiconductor regions (source, drain) 87 having an LDD structure can be formed. According to the steps so far, the n-channel-type MISFET Qn can be formed.

Next, the silicon oxide film 89 to be an interlayer insulating film is formed over the substrate 81, and then the silicon oxide film 89 is subjected to dry etching using a photoresist film patterned by the photolithography technique as a mask, thereby the contact holes are formed over the n-type semiconductor regions (source, drain) 87. Then, the barrier metal film (TiN film/Ti film) is formed over the substrate 81 including the insides of the contact holes, and then the W film is further deposited, so that the contact holes are filled with the W film. Then, the barrier metal film and the W film on the silicon oxide film 89 except for the contact holes are removed by, for example, the CMP process, thereby the plugs 90 are formed.

Next, the wiring line 91 is formed in the region where the stacked wiring is to be formed. The wiring line 91 is formed by sequentially depositing the Ti film, Al alloy film, and TiN film over the silicon oxide film 89, then etching the thin films.

Next, the silicon oxide film 92 is formed over the substrate 81, and then the silicon oxide film 92 is etched to form the contact hole. Then, the barrier metal film (TiN film/Ti film) and the W film are sequentially deposited over the silicon oxide film 92 including the inside of the contact hole, and then the barrier metal film and the W film over the silicon oxide film 92 are removed by the CMP process, so that the plug 93 is formed.

Next, the wiring line 94 including thin films of 3 layers of the Ti film, Al alloy film, and TiN film is formed in the region where the stacked wiring is to be formed according to the same step as the step of forming the wiring line 91.

Next, the silicon oxide film 95 is formed over the substrate 1, and then the silicon oxide film 95 is etched to form the contact holes 96. Then, the plug 97 is formed in the contact hole 96 according to the same step as the step of forming the plug 93.

Next, the wiring line 98A and the wiring line 98B are formed in the region where the stacked wiring is to be formed and the region where the pad is to be formed according to the same step as the step of forming the wiring lines 91 and 94 respectively, the wiring lines 98A, 98B including thin films of 3 layers of the Ti film, Al alloy film, and TiN film, and then the silicon oxide film 99 using high density plasma is deposited over the substrate 81 by a plasma CVD process. Then, the silicon oxide film 100 is deposited over the silicon oxide film 99 by the plasma CVD process using high density plasma.

Then, a surface of the silicon oxide film 100 is polished by, for example, the CMP process to make the surface flat.

Next, the silicon oxide films 100, 99 are etched using a photoresist film (omitted to be shown) patterned by the photolithography technique, thereby the contact holes 101A penetrating to the wiring line 98A are formed in the region where the stacked wiring is to be formed, and the contact hole 101B penetrating to the wiring line 98B is formed in the region where the pad is to be formed.

Next, a barrier metal film including a Ti film about 10 nm in thickness and a TiN film about 50 nm in thickness is deposited over the silicon oxide film 100 including the insides of the contact holes 101A and the contact hole 101B. Then, the W film about 500 nm in thickness is deposited over the barrier metal film.

Next, the W film and the barrier metal film outside the contact holes 102A and 102B are removed by the CMP process, thereby the plugs 102A are formed within the contact holes 101A, and the plug 102B is formed within the contact hole 101B.

Next, the Ti film, Al alloy film, and TiN film are sequentially deposited over the silicon oxide film 100, so that a stacked film including these thin films is formed. Then, the stacked film is patterned by etching, thereby the wiring line 103 is formed in the region where the stacked wiring is to be formed, and the pad BP is formed where the pad is to be formed.

Next, the silicon oxide film 104A about 200 nm in thickness and the silicon nitride film 104B about 800 nm in thickness are sequentially deposited over the surface of the substrate 81 so that the surface protection film 104 is formed, and then the silicon nitride film 104B and the silicon oxide film 104A over the pad BP are removed by etching, thereby the opening 105 in a planar rectangle shape is formed.

Next, the base film for bump electrode 106A is deposited over the surface protection film 104 including the inside of the opening 105. The base film for bump electrode 106A can be formed by, for example, a single substance film of a film of high-melting-point metal such as Ti or TiW, or a stacked film having a structure of stacking a Ni (nickel) film and an Au film in order from a lower layer on a Ti film. Then, the bump electrode 106 in a planar rectangle shape including Au is formed. The bump electrode 106 can be formed by forming an Au film by a plating process using a photoresist pattern having an opening provided by the photolithography technique as a mask. Then, the photoresist film is removed, and furthermore the base film for bump electrode 106A is removed by etching except for the base film under the bump electrode 106.

Next, a probe test is performed according to the same step as the probe test step (see FIGS. 39 to 42) described in the embodiment 1. As described in the embodiment 1, when the probe test is performed, first, appearance of the main surface of the substrate 81 is tested using the appearance tester 51 (see FIG. 39). In the appearance test of the main surface of the substrate 81 using the appearance tester 51, as described using FIG. 40 in the embodiment 1, the inside of each chip region is divided into a region (corresponding to region 10A (see FIG. 40)) in an inner side from positions a distance (first distance), which is longer than a short side of the bump electrode 106, apart from the bump electrode 106 in the main surface of the substrate 81, and other one region. Then, the relatively inside region in the main surface of the chip is divided into a plurality of rectangular regions (second regions), and appearance is tested for each region (second region). The relatively outside region, in which the bump electrode 106 is arranged and which is disposed in a manner of enclosing the relatively inside region in the main surface of the chip, is divided, for example, into rectangular regions (first regions) of which one side is smaller than one side of the second region, and appearance is tested for each region (first region). As abnormality in height of the pad 11 described using FIG. 41 in the embodiment 1, abnormality in height is tested for the bump electrode 106 of the embodiment 3 according to the same standard. As shown by FIG. 42 in the embodiment 1, results of the appearance test are collected as wafer map data (first data) according to arrangement of respective chip regions in a plane of the substrate 81, and positions (first positions) where chip regions (first chip regions) in which abnormality in appearance was detected and positions where other chip regions are disposed are recorded in the wafer map data.

When the appearance test is finished for all the chip regions in the substrate 81, the wafer map data are further added with information for identifying the substrate 81 and then transmitted to the server 52 (see FIG. 39), and stored therein. Then, the substrate 81 is carried into a probe tester 53, and wafer map data corresponding to the substrate 81 carried into the probe tester 53 are transmitted from the server 52 to the probe tester 53.

In the probe tester 53, the probe test using the probe card (see FIGS. 1 and 2) having the membrane sheet 2 described in the embodiment 1 (see FIGS. 6 to 38 (except for FIGS. 10 and 12)) is performed. The probe tester 53 performs the probe test to the substrate 81 based on the wafer map data transmitted from the server 52. That is, the probe test is omitted for chip regions in which abnormality in appearance was detected in the wafer map data. As a result, a step of contacting the probes 7A, 7B (see FIGS. 6 to 8) to the bump electrode 106 can be omitted for the chip regions in which abnormality in appearance was detected.

When the probes 7A, 7B are contacted to the bump electrode 106, if a foreign substance is adhered to the mains surface of the substrate 81, or a protruded portion is formed in the bump electrode 106, the membrane sheet 2 may be anxiously deformed by running on the foreign substance or the protruded portion, and particularly when the foreign substance or the protruded portion exists near the probes 7A, 7B, a trouble that the probes 7A, 7B stick into the membrane 2 may anxiously occur. Even if the membrane 2 is not broken unlike this, the membrane sheet 2 may be anxiously damaged due to contact to the foreign substance or the protruded portion. Thus, the step of contacting the probes 7A, 7B to the bump electrode 106 is omitted for the chip regions in which abnormality in appearance was detected in the wafer map data, thereby such breakage or damage of the membrane sheet 2 can be prevented.

Then, the substrate 81 is divided into individual chips, so that the semiconductor integrated circuit device of the embodiment 3 is fabricated.

Figure 48:
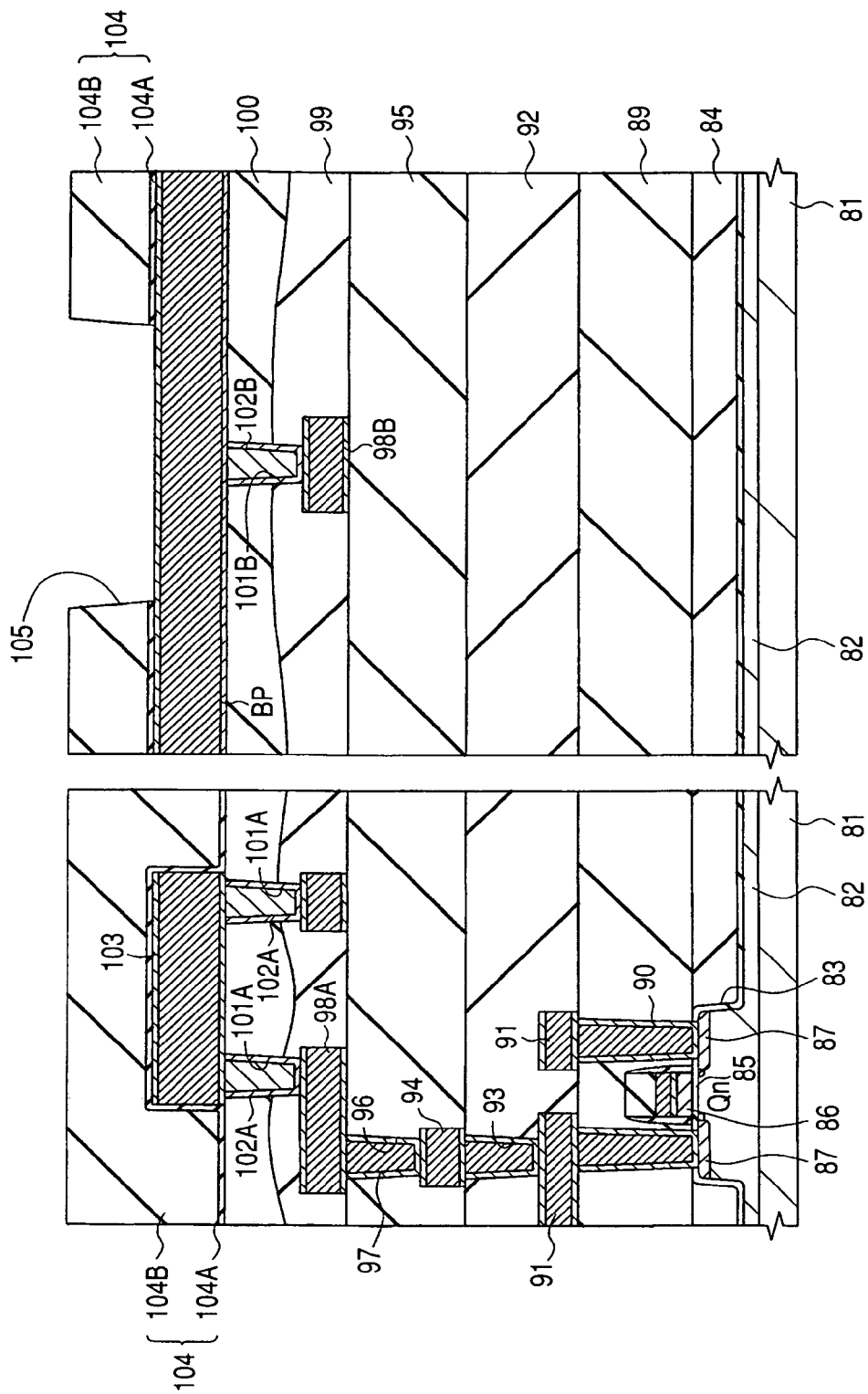
FIG. 48 shows a relevant-part section view during the fabrication process of the semiconductor integrated circuit device of the still different embodiment of the invention.

While an example of a chip that had the bump electrode 106 formed therein, and was mounted via the bump electrode 106 was described in the embodiment 3, a structure where a chip is mounted using a bonding wire instead of the bump electrode 106 may be used. In such a case, as shown in FIG. 48, a process is the same to a step of forming the opening 105. Then, the probe test is performed according to the same step as the probe test step. At that time, the probes 7A, 7B are contacted to the pad BP. After the probe test is finished, the substrate 81 is divided into individual chips, and bonding wires (omitted to be shown) are coupled to the pad BP and a mounting board (omitted to be shown), so that the chip is mounted over the mounting board.

Figure 49:
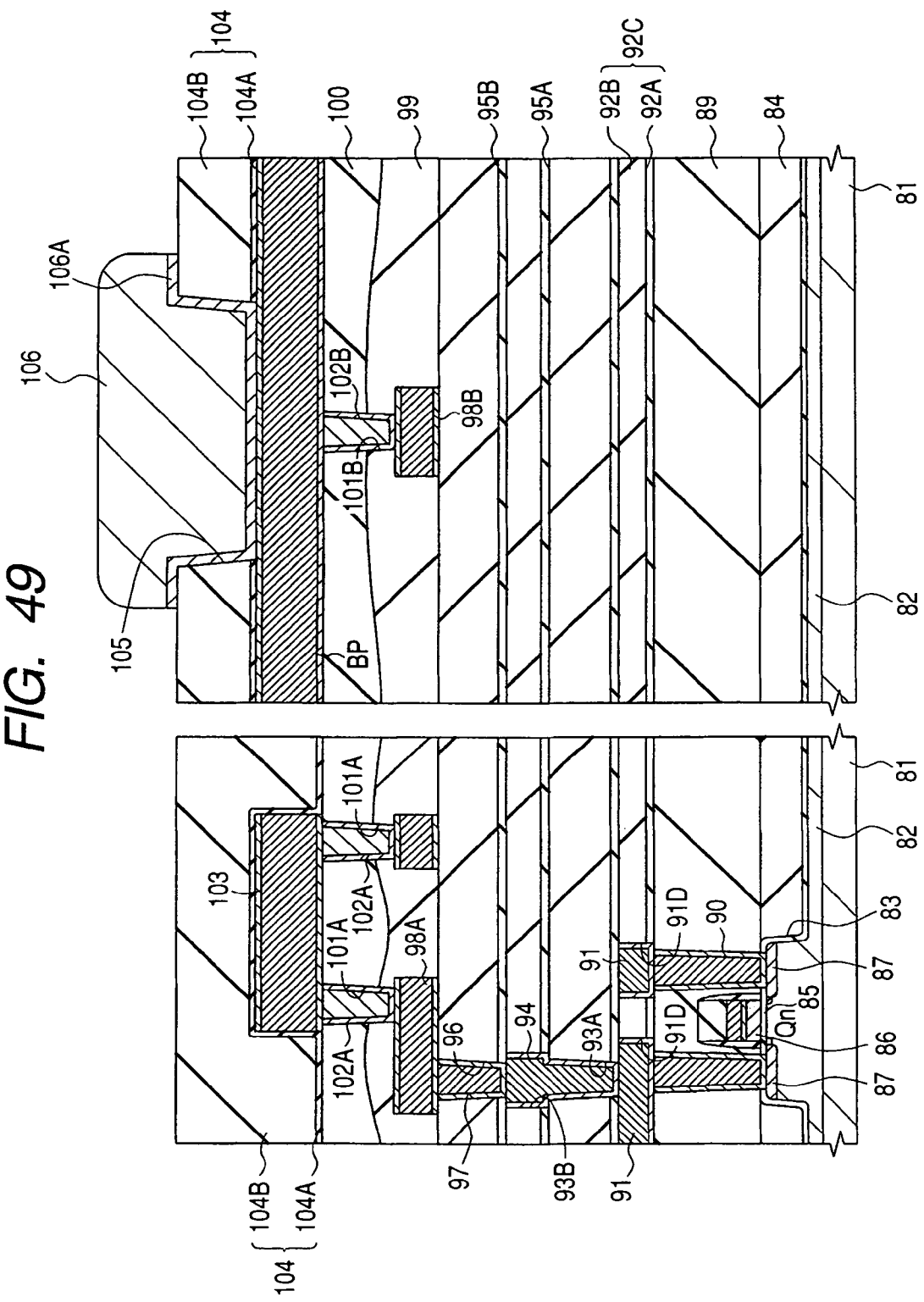
FIG. 49 shows a relevant-part section view during the fabrication process of the semiconductor integrated circuit device of the still different embodiment of the invention.

While the wiring lines 11 and 14 were formed containing Al as a main component in the embodiment 3, it may be formed containing Cu (copper) as a main component as shown in FIG. 49. In such a case, after the plugs 90 are formed, an etching stopper film 92A including a silicon nitride film and a silicon oxide film 92B are sequentially deposited over the silicon oxide film 9, thereby an interlayer insulating film 92C is formed.

Next, the interlayer insulating film 92C is etched to form wiring grooves 91D of which the bottom is contacted to the plugs 90. Then, a barrier metal film including a titanium nitride film and a Cu film are sequentially deposited over the silicon oxide film 92B including the insides of the wiring grooves 91D, and then the barrier metal film and the Cu film on the silicon oxide film 92B are removed by the CMP process, thereby wiring lines 91 are formed within the wiring grooves 91D. A copper alloy film containing Cu of about 80 weight percent or more may be used instead of the Cu film.

Next, a silicon nitride film, silicon oxide film, silicon nitride film, and silicon oxide film are sequentially deposited over the interlayer insulating film 92C, thereby an interlayer insulating film 95A is formed. In formation of the interlayer insulating film 95A, a low-dielectric-constant insulating film (for example, SiOF) having a dielectric constant of about 4.3 or less may be formed instead of the silicon oxide film. Since the total dielectric constant of wiring lines of a semiconductor integrated circuit device can be reduced by forming such a low-dielectric-constant insulating film, a trouble such as wiring delay can be prevented. Then, the interlayer insulating film 95A is etched to form a contact hole 93A of which the bottom is contacted to the wiring line 91, and then the silicon oxide film and the silicon nitride film as upper layers in the interlayer insulating film 95A are etched, thereby a wiring groove 93B is formed.

Next, a barrier metal film including a titanium nitride film and a Cu film are sequentially deposited over the interlayer insulating film 95A including the insides of the wiring groove 93B and the contact hole 93A, and then the barrier metal film and the Cu film over the interlayer insulating film 95A are removed by the CMP process, thereby the wiring line 94 is formed.

Next, a silicon nitride film and a silicon oxide film are sequentially deposited over the interlayer insulating film 95A, thereby an interlayer insulating film 95B is formed. In formation of the interlayer insulating film 95B, a low-dielectric-constant insulating film (for example, SiOF) having a dielectric constant of about 4.3 or less may be formed instead of the silicon oxide film. Then, the interlayer insulating film 95B is etched, thereby a contact hole 96 of which the bottom is contacted to the wiring line 94 is formed.

Next, a barrier metal film (TiN film/Ti film) and a W film are sequentially deposited over the interlayer insulating film 95B including the inside of the contact hole 96, and then the barrier metal film and the W film over the interlayer insulating film 95B are removed by the CMP process, thereby the plug 97 is formed. At that time, a Cu film may be used instead of the W film.

Figure 50:
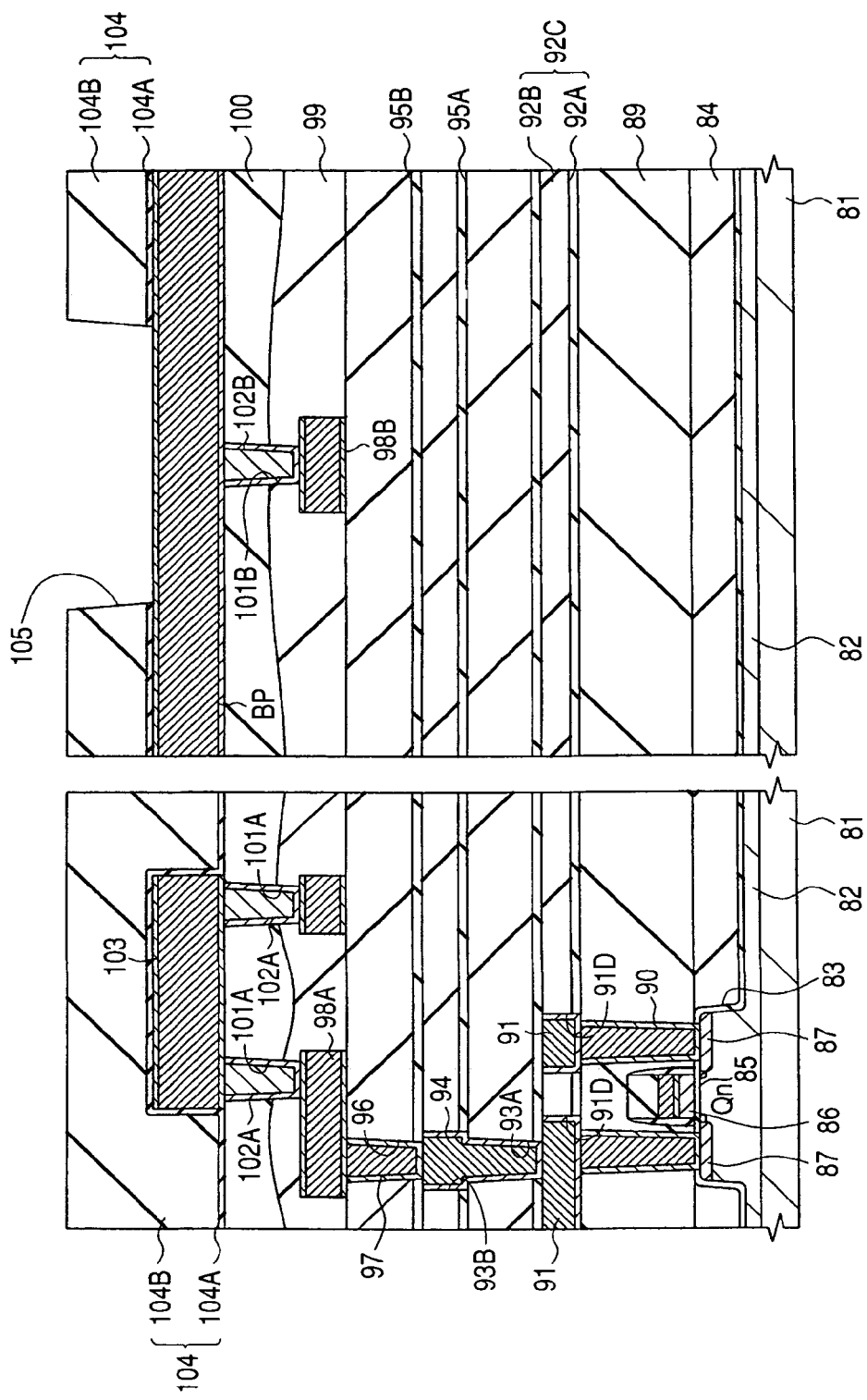
FIG. 50 shows a relevant-part section view during the fabrication process of the semiconductor integrated circuit device of the still different embodiment of the invention.

Subsequent steps are the same as the steps of forming the wiring lines 98A, 98B described using FIG. 47, and after the bump electrode 106 is formed, the probe test is carried out according to the same step as the probe test step. A structure (see FIG. 50), in which the pad BP under the opening 105 is coupled with a bonding wire as the structure shown in FIG. 48, may be used without forming the bump electrode 106.

Figure 51:
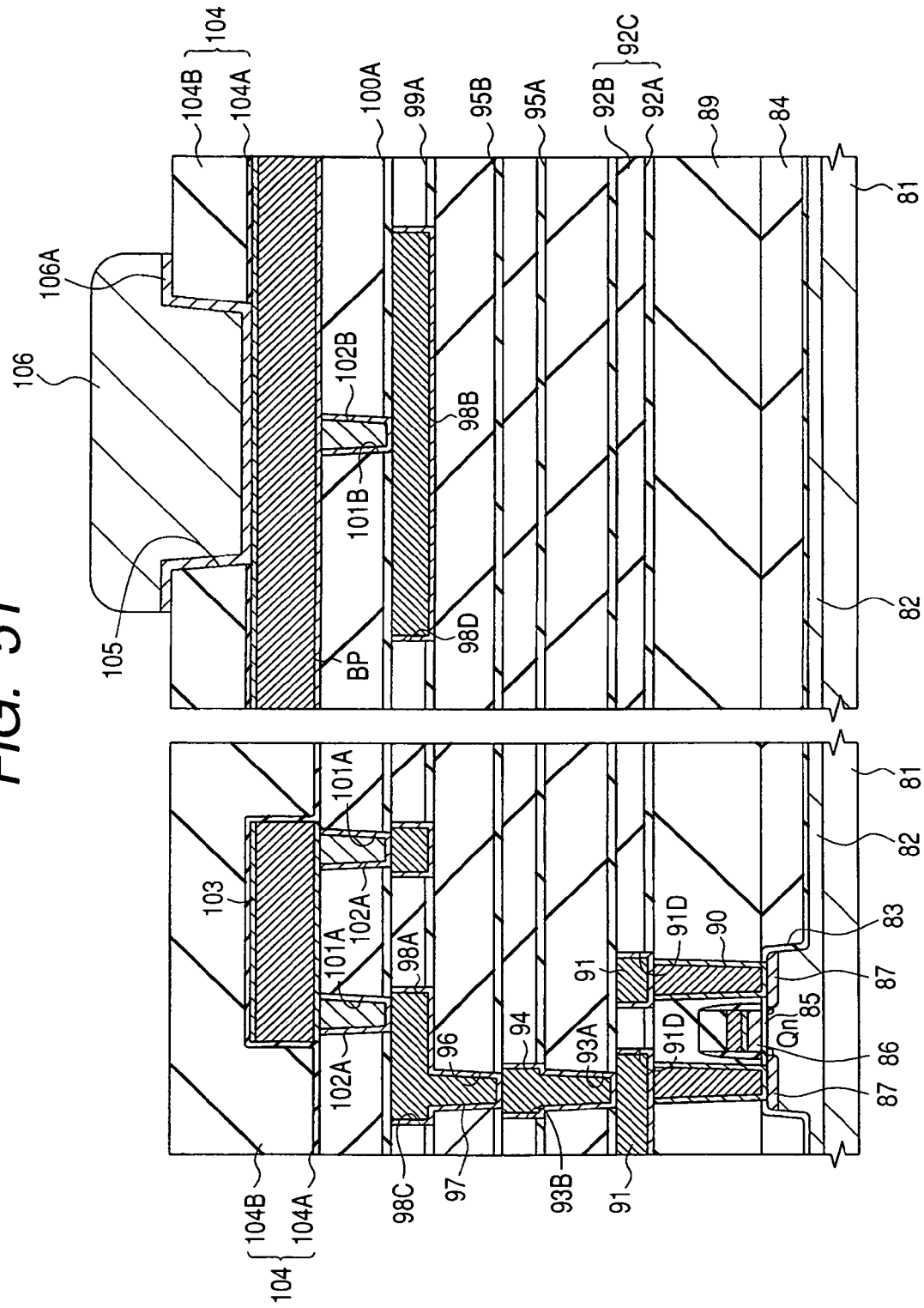
FIG. 51 shows a relevant-part section view during the fabrication process of the semiconductor integrated circuit device of the still different embodiment of the invention.
Figure 52:
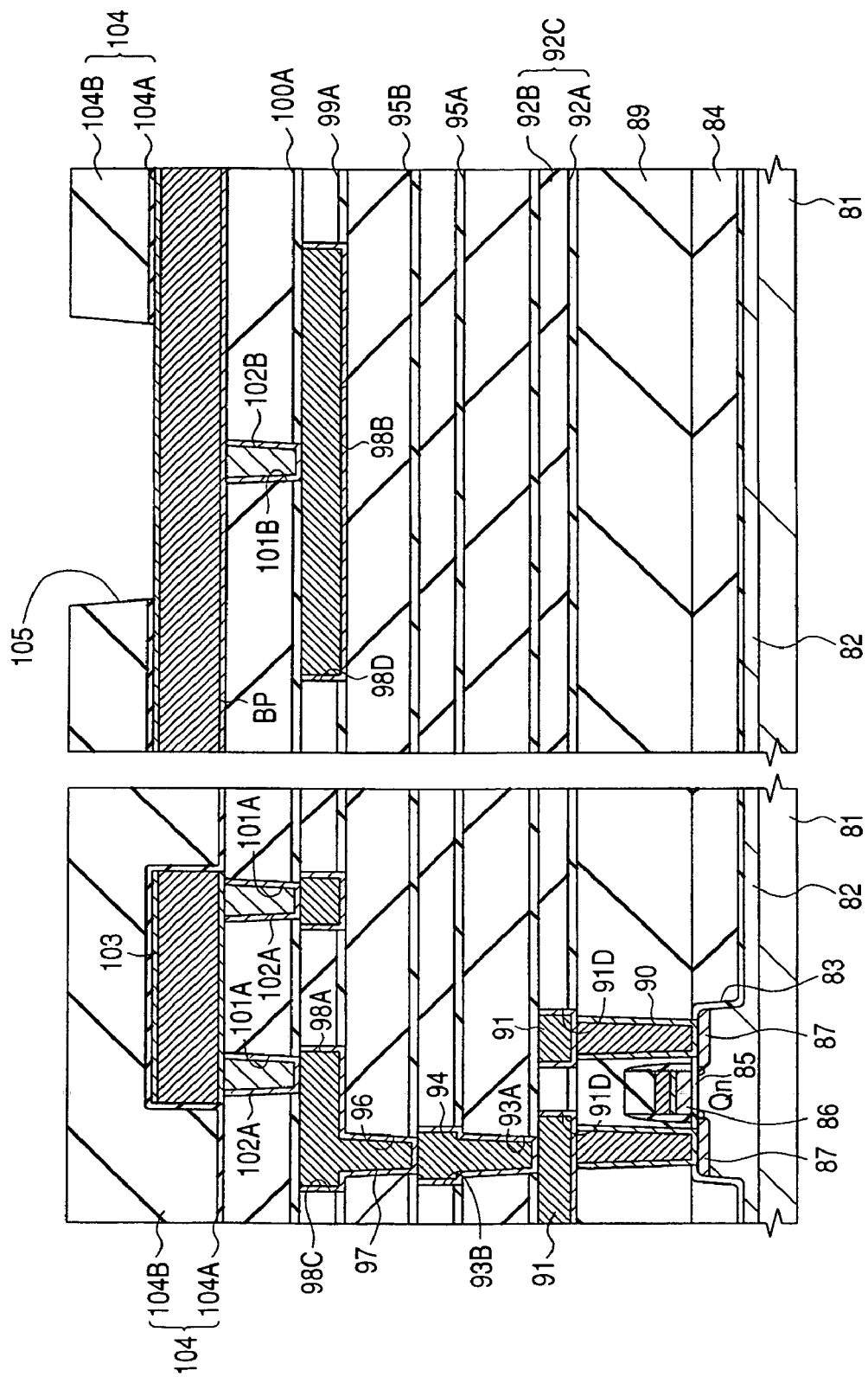
FIG. 52 shows a relevant-part section view during the fabrication process of the semiconductor integrated circuit device of the still different embodiment of the invention.

The wiring lines 98A and 98B may be formed using a Cu film as a main conductive layer (see FIGS. 51 and 52). In this case, silicon oxide films 99 and 100 are substituted for stacked films 99A and 10A formed by stacking a silicon nitride film and a silicon oxide film from a lower layer. The wiring lines 98A and 98B can be formed in wiring grooves 98C, 98D formed by etching the stacked film 99A according to the same step as the step of forming the wiring line 94, respectively. The plug 97 can be collectively formed during formation of the wiring line 98A.

While the invention made by the inventor has been specifically described according to the embodiments, it will be appreciated that the invention is not limited to the embodiments, and can be variously altered or modified without departing from the gist of the invention.

For example, while the case that the probe test was carried out by contacting the probe formed in the membrane sheet to the bump electrode was described in the embodiments, the probe test may be carried out by contacting the probe to the pad disposed under the bump electrode before forming the bump electrode.

INDUSTRIAL APPLICABILITY

The fabrication method of the semiconductor integrated circuit device of the invention can be widely used for a probe test step in a fabrication method of a semiconductor integrated circuit device and the like.

The invention claimed is:

1. A fabrication method of a semiconductor integrated circuit device comprising the steps of:
    (a) preparing a wafer in which a wafer process is substantially completed, and bonding pad openings or bump electrodes over bonding pads are formed in a plurality of chip regions respectively in a process of fabricating a semiconductor integrated circuit;
    (b) performing an appearance test for at least the bonding pad openings or the bump electrodes and peripheries of them in each of the chip regions over the wafer; and
    (c) performing the probe test for a second group of chip regions that do not belong to the first group using the membrane probe, without performing the probe test for a first group of one or more chip regions, which are inappropriate to be subjected to the probe test using the membrane probe, among the chip regions, based on a result of the appearance test when the chip regions are subjected to a probe test using a membrane probe,
    wherein the appearance test of the step (b) comprises the following subordinate steps of:
    (1) performing the appearance test to the bonding pad openings or the bump electrodes and peripheries of them at a first accuracy; and
    (2) performing the appearance test to portions other than the bonding pad openings or the bump electrodes and the peripheries of them at a second accuracy rougher than said first accuracy.

2. The fabrication method of the semiconductor integrated circuit device according to claim 1:
    wherein projection needles of the membrane probe are not contacted to the bonding pads or the bump electrodes as electrodes for probes for the first group of chip regions during the probe test of the step (c).

3. The fabrication method of the semiconductor integrated circuit device according to claim 2:
    wherein the electrodes for probes are bump electrodes.

4. The fabrication method of the semiconductor integrated circuit device according to claim 3:
    wherein the electrodes for probes are bump electrodes containing gold as a major component.

5. The fabrication method of the semiconductor integrated circuit device according to claim 2:
    wherein the electrodes for probes are bonding pads.

6. The fabrication method of the semiconductor integrated circuit device according to claim 2:

wherein the electrodes for probes are bonding pads containing aluminum as a major component.

7. The fabrication method of the semiconductor integrated circuit device according to claim 1:

wherein the projection needles of the membrane probe are not contacted to the bonding pads or the bump electrodes as electrodes for probes to a level at which at least electrical measurement can be performed for the first group of chip regions during the probe test of the step (c).

8. The fabrication method of the semiconductor integrated circuit device according to claim 1:

the appearance test of the step (b) includes a step of optically testing whether a foreign substance or an abnormal pattern on the wafer damages the membrane probe during the probe test of the step (c).

9. The fabrication method of the semiconductor integrated circuit device according to claim 1:

wherein at least part of an interconnection layer below the bonding pads or the bump electrodes includes a buried wiring line formed of a wiring material containing copper as a major component.

10. A fabrication method of a semiconductor integrated circuit device, comprising the steps of:

(a) preparing a wafer in which a wafer process is substantially completed, and electrodes for probes are formed in a plurality of chip regions respectively, in a fabrication process of a semiconductor integrated circuit;

(b) performing an appearance test for at least the electrodes for probes and peripheries of them in each of the chip regions over the wafer; and (c) performing the probe test for a second group of chip regions that do not belong to the first group using the membrane probe, without performing the probe test for a first group of one or more chip regions, which are inappropriate to be subjected to the probe test using the membrane probe, and contacting projection needles of the membrane probe to the electrodes for probes, among the chip regions, based on a result of the appearance test when the chip regions are subjected to a probe test using a membrane probe, wherein the appearance test of the step (b) comprises the following subordinate steps of:

(1) performing the appearance test to the electrodes for probes and peripheries of them at a first accuracy; and (2) performing the appearance test to portions other than the electrodes for probes and the peripheries of them at a second accuracy rougher than the first accuracy.

11. The fabrication method of the semiconductor integrated circuit device according to claim 10:

wherein the appearance test of the step (b) includes optically testing whether a foreign substance or an abnormal pattern over the wafer damages the membrane probe during the probe test of the step (c).

12. The fabrication method of the semiconductor integrated circuit device according to claim 10:

wherein the electrodes for probes are bump electrodes.

13. The fabrication method of the semiconductor integrated circuit device according to claim 10:

wherein the electrodes for probes are bonding pads.

14. The fabrication method of the semiconductor integrated circuit device according to claim 10:

wherein the electrodes for probes are bump electrodes containing gold as a major component.

15. The fabrication method of the semiconductor integrated circuit device according to claim 10:

wherein the electrodes for probes are bonding pads containing aluminum as a major component.

16. The fabrication method of the semiconductor integrated circuit device according to claim 10:

wherein at least part of an interconnection layer below the electrodes for probes includes a buried wiring line formed of a wiring material containing copper as a major component.

17. A fabrication method of a semiconductor integrated circuit device, comprising the steps of:

(a) preparing a wafer in which a wafer process is substantially completed, and gold bump electrodes containing gold as a major component are formed in a plurality of chip regions respectively, in a process of fabricating a semiconductor integrated circuit;

(b) performing an appearance test for at least the gold bump electrodes and peripheries of them in each of the chip regions over the wafer; and (c) performing the probe test for a second group of chip regions that do not belong to the first group using the membrane probe, without performing the probe test for a first group of one or more chip regions, which are inappropriate to be subjected to the probe test using the membrane probe, and contacting projection needles of the membrane probe to the gold bump electrodes to a level at which at least electrical measurement can be performed, among the chip regions, based on a result of the appearance test when the chip regions are subjected to a probe test using a membrane probe, wherein the appearance test of the step (b) comprises the following subordinate steps of:

(1) performing the appearance test to the gold bump electrodes and peripheries of them at a first accuracy; and (2) performing the appearance test to portions other than the gold bump electrodes and the peripheries of them at a second accuracy rougher than the first accuracy.

* * * * *